(12) United States Patent
Imaki et al.

(10) Patent No.: US 6,801,553 B2
(45) Date of Patent: Oct. 5, 2004

(54) WAVELENGTH MONITOR AND SEMICONDUCTOR LASER DEVICE

(75) Inventors: Masao Imaki, Tokyo (JP); Yoshihito Hirano, Tokyo (JP); Makoto Sato, Tokyo (JP); Kenji Masuda, Tokyo (JP); Akihiro Adachi, Tokyo (JP); Yasunori Nishimura, Tokyo (JP); Shinichi Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/988,662

(22) Filed: Nov. 20, 2001

(65) Prior Publication Data

US 2002/0075910 A1 Jun. 20, 2002

(30) Foreign Application Priority Data

Dec. 6, 2000 (JP) .................................. 2000-371471
Apr. 27, 2001 (JP) .................................. 2001-132746

(51) Int. Cl.[7] .............................................. H01S 3/13
(52) U.S. Cl. ................................ 372/32; 372/29.02
(58) Field of Search ............................ 372/29.02, 32

(56) References Cited

U.S. PATENT DOCUMENTS

| 3,951,509 A | * | 4/1976 | Noguchi et al. ............. 359/17 |
|---|---|---|---|
| 4,998,256 A | * | 3/1991 | Ohshima et al. ............. 372/32 |
| 5,036,185 A | * | 7/1991 | Ando ....................... 250/201.5 |
| 5,095,476 A | * | 3/1992 | Greve et al. ............. 369/110.02 |
| 5,224,084 A | * | 6/1993 | Takahashi ................. 369/44.23 |
| 5,559,767 A | * | 9/1996 | Matsui ..................... 369/44.23 |
| 5,825,792 A | * | 10/1998 | Villeneuve et al. ........... 372/32 |
| 6,101,211 A | * | 8/2000 | Wakabayashi et al. ...... 372/102 |
| 6,181,717 B1 | * | 1/2001 | Kner et al. ................... 372/20 |
| 6,272,157 B1 | * | 8/2001 | Broutin et al. ................ 372/32 |
| 6,301,216 B1 | * | 10/2001 | Takahashi ............... 369/112.28 |
| 6,542,664 B2 | * | 4/2003 | Srinivasan et al. ............ 385/33 |
| 6,587,214 B1 | * | 7/2003 | Munks ....................... 356/519 |
| 2002/0061039 A1 | * | 5/2002 | Le Gall et al. ................ 372/32 |

FOREIGN PATENT DOCUMENTS

| JP | 58-12831 | 1/1983 |
|---|---|---|
| JP | 63-193004 | 8/1988 |
| JP | 5-149793 | 6/1993 |
| JP | 10-79551 | 3/1998 |

* cited by examiner

*Primary Examiner*—Don Wong
*Assistant Examiner*—Leith Al-Nazer
(74) *Attorney, Agent, or Firm*—Burns, Doane, Swecker & Mathis, L.L.P.

(57) ABSTRACT

A wavelength monitor comprises a cylindrical lens configured to allow a laser beam emitted from a semiconductor laser to pass therethrough, first and second photodetectors configured to receive the laser beam through the cylindrical lens, and a wavelength filter disposed in an optical path between the semiconductor laser and the first photodetector.

40 Claims, 12 Drawing Sheets

WAVELENGTH MONITOR AND SEMICONDUCTOR LASER DEVICE

The present application is based upon Japanese Patent Application No. 2000-371471 filed Dec. 6, 2000 and Japanese Patent Application No. 2001-132746 filed Apr. 27, 2001, the entire disclosures of which are incorporated herein by reference.

BACKGROUND OF THE INVENTION

1. Field of the Invention

The present invention relates to a wavelength monitor and a semiconductor laser device in which a wavelength of a laser beam outputted from a semiconductor laser is monitored.

2. Description of Related Art

A dense wavelength division multiplexing (DWDM) optical communication has been performed in an optical communication field using optical fibers. In this DWDM optical communication, laser beams, which are emitted from a number of semiconductor lasers and have various wavelengths, pass through a plurality of optical fibers and are multiplexed to produce a multiplexed laser beam, the multiplexed laser beam is lead to an optical fiber, and the multiplexed laser beam is transmitted to a destination. Thereafter, the multiplexed laser beam is demultiplexed to a plurality of laser beams, and the laser beams are used for various purposes.

In recent years, a technique in which laser beams are multiplexed at high density has been proposed in order to efficiently transmit the laser beams. In this technique, wavelength intervals of the laser beams to be multiplexed are narrowed (for example, wavelength intervals of the laser beams are set to specific wavelength intervals equivalent to 50 GHz). Therefore, to multiplex the laser beams without interfering with each other, it is required for each semiconductor laser device to set a wavelength of the laser beam with high stability. To achieve this requirement, an intensity and wavelength of a backward-directed laser beam (also referred to as a backward laser beam), which is emitted from a semiconductor laser simultaneously with a forward-directed laser beam (also referred to as a forward laser beam) to an optical fiber, is detected and monitored, and the wavelength of the backward laser beam is controlled according to the intensity of the backward laser beam to adjust an wavelength of the forward laser beam. Also, in a laser beam measuring field, an intensity and wavelength of a backward laser beam emitted from a semiconductor laser is monitored, and a wavelength of a beam of homogeneous light emitted from the semiconductor laser is measured with high precision.

FIG. 23 is a view schematically showing the configuration of a conventional wavelength monitor in which an intensity and varying wavelength of a backward laser beam emitted from a semiconductor laser is monitored. The conventional wavelength monitor shown in FIG. 23 is disclosed in Published Unexamined Japanese Patent Application H10-79551 (1998). As shown in FIG. 23, a backward laser beam emitted from a semiconductor laser 126 is collimated in a lens 127, and the collimated laser beam transmits through a quarter wavelength plate 128 to transform a linear polarization of the laser beam into a circular polarization. Thereafter, the circularly polarized laser beam is incident on a first polarized beam splitter 129 to divide the incident laser beam into a first laser beam 130 and a second laser beam 131. The first polarized beam splitter 129 has a band pass filter film 132 placed on a first output end face. The first laser beam 130 transmits through the band pass filter film 132 and is received in a first photodiode 133. An output of electric current of the first laser beam 130 detected in the first photodiode 133 fluctuates with a varying wavelength of the backward laser beam emitted from the semiconductor laser 126. The second laser beam 131 is incident on a second polarized beam splitter 134 to divide the incident laser beam into a third laser beam 135 and a fourth laser beam 136. The second polarized beam splitter 134 has a band pass filter film 137 placed on a third output end face. The third laser beam 135 transmits through a band pass filter film 137 and is received in a second photodiode 138. An output of electric current of the third laser beam 135 detected in the second photodiode 138 fluctuates with a varying wavelength of the backward laser beam emitted from the semiconductor laser 126. The fourth laser beam 136 is received in a third photodiode 139 to detect an output of electric current of the fourth laser beam 136. In the conventional wavelength monitor, the outputs of electric current detected in both the first photodiode 133 and the second photodiode 138 are used to monitor the wavelength of the backward laser beam emitted from the semiconductor laser 126, and the output of electric current detected in the third photodiode 139 is used to monitor the intensity of the backward laser beam emitted from the semiconductor laser 126. Therefore, the wavelength and intensity of a forward laser beam emitted from the semiconductor laser 126 can be stabilized.

However, because the conventional wavelength monitor has the above-described configuration, two polarized beam splitters 129 and 134 and two band pass filters 132 and 137 are required. Therefore, a problem has arisen that the number of parts is increased in the conventional wavelength monitor so as to heighten a product cost.

Also, because the backward laser beam emitted from the semiconductor laser 126 is split to propagate in three directions, optical elements such as the lens 127 adjusting the convergence of the backward laser beam emitted from the semiconductor laser 126, the polarized beam splitters 129 and 134 and the photodiodes 133, 138 and 139 are widely separated in a plane. In this case, another problem has arisen that it is difficult to accurately arrange the optical elements with respect to the backward laser beam propagated in three directions.

Also, because three plates, on which the photodiodes 133, 138 and 139 are arranged respectively, separately move in different directions due to a temperature variation and/or a mechanical variation occurring over a long period of time, a positional relationship among the semiconductor laser 126, the lens 127 and the photodiodes 133, 138 and 139 undergoes variation. In this case, another problem has arisen that an intensity of the laser beam detected in each photodiode fluctuates even though an intensity of the laser beam emitted from the semiconductor laser 126 is constant.

Also, because the second and third photodiodes 138 and 139 are arranged on two planes positioned orthogonal to each other, the planes separately move in different directions due to a temperature variation and/or a mechanical variation occurring over a long period of time. Therefore, another problem has arisen that an output of electric current of the laser beam detected in each photodiode is not stabilized.

In Published Unexamined Japanese Patent Application H5-149793 (1993), a conventional semiconductor laser device is disclosed. In this device, a semiconductor laser and a wavelength monitor for detecting a varying wavelength of a laser beam emitted from the semiconductor laser are arranged. Also, in Published Unexamined Japanese Patent Application S58-12831 (1983), a wavelength measuring device for detecting a wavelength of a laser beam is disclosed. In these devices, a laser beam emitted from a beam source is directly received by one photodetector. Also, the laser beam is received by another photodetector through a filter. These photodetectors are placed on a carrier. In this case, though the precision of the position of the photodetectors is relatively high with respect to a vertical direction, it is difficult to precisely arrange the photodetectors in horizontal directions. Therefore, a problem has arisen that it is difficult to precisely arrange the photodetectors in horizontal directions such that the whole laser beam is correctly detected in the photodetectors or such that a preset part of the laser beam is correctly detected in each photodetector. Also, positions of the photodetectors shift from each other in horizontal directions due to a temperature variation and/or a mechanical variation occurring over a long period of time. Therefore, another problem has arisen that it is difficult to stably and correctly detect a wavelength of the laser beam.

SUMMARY OF THE INVENTION

An object of the present invention is to provide, with due consideration to the drawbacks of the conventional wavelength monitor and the conventional semiconductor laser device, a wavelength monitor and a semiconductor laser device in which a wavelength of a laser beam emitted from a semiconductor laser is always monitored with high precision.

Also, another object of the present invention is to provide a wavelength monitor and a semiconductor laser device in which an intensity and varying wavelength of a laser beam emitted from a semiconductor laser is correctly monitored by using a simple arrangement of constituent elements that does not require a plurality of polarized beam splitters and a plurality of band pass filters.

According to one aspect of the present invention, a wavelength monitor is provided comprising a cylindrical lens configured to allow a laser beam emitted from a semiconductor laser to pass therethrough, first and second photodetectors configured to receive the laser beam passed through the cylindrical lens, and a wavelength filter disposed in an optical path between the semiconductor laser and the first photodetector.

According to another aspect of the present invention, a semiconductor laser device is provided comprising a semiconductor laser configured to emit a laser beam, a cylindrical lens configured to allow a laser beam emitted from a semiconductor laser to pass therethrough, first and second photodetectors configured to receive the laser beam passed through the cylindrical lens, and a wavelength filter disposed in an optical path between the semiconductor laser and the first photodetector.

In the above configurations, the laser beam transmitted through the cylindrical lens is uniaxially converged in a convergence direction, and the uniaxially converged laser beam is received by the first and second photodetectors. Therefore, even if the position of an optical element such as the semiconductor laser, the first photodetector or the second photodetector is shifted in the convergence direction, the laser beam is still received by the first and second photodetectors. Also, even if the position of an optical element is shifted in a direction perpendicular to the convergence direction in a plane of beam receiving faces of the first and second photodetectors, a beam area of the laser beam received by each photodetector does not change.

Accordingly, the wavelength of the laser beam emitted from the semiconductor laser can be always monitored with high precision according to both portions of the laser beam received by the first and second photodetectors, respectively, regardless of whether the position of the semiconductor laser, the first photodetector or the second photodetector is shifted.

BRIEF DESCRIPTION OF THE DRAWINGS

These and other objects and advantages of the present invention will become apparent to those skilled in the art upon reading the following detailed description of exemplary embodiments, in conjunction with the accompanying drawings, wherein.

DETAILED DESCRIPTION

Embodiments of the present invention will now be described with reference to the accompanying drawings.

Embodiment 1

Figure 1:
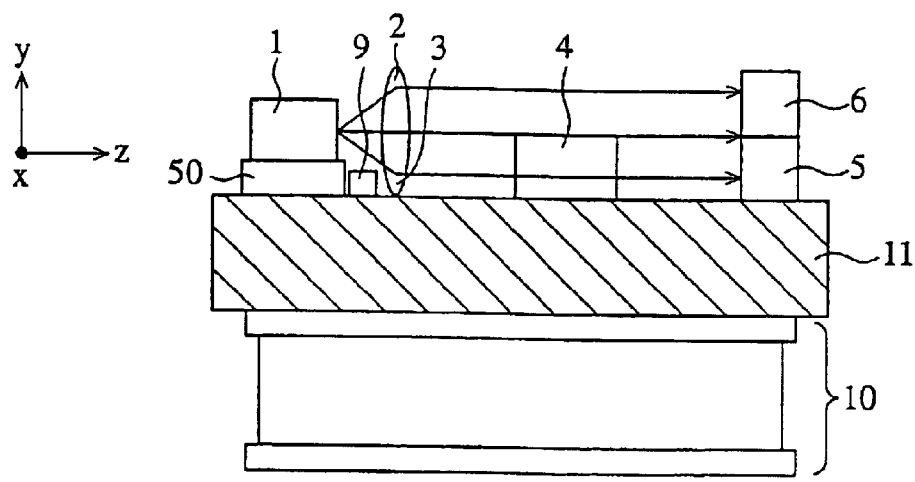
FIG. 1 is a side view showing an optical system including a semiconductor laser device according to a first embodiment of the present invention.

FIG. 1 is a side view showing an optical system including an exemplary semiconductor laser device according to a first embodiment of the present invention. In FIG. 1, reference numeral 1 indicates a semiconductor laser. A forward laser beam (not shown) is emitted from the semiconductor laser 1 in a forward direction (the left direction in FIG. 1), and a signal laser beam 2 (also referred to as a backward laser beam) is emitted from the semiconductor laser 1 in a rearward direction (the right direction in FIG. 1). Reference numeral 3 indicates a lens for collimating the signal laser beam 2 emitted from the semiconductor laser 1. Reference numeral 4 indicates a wavelength filter for receiving a lower half part of the signal laser beam 2 and for transmitting the signal laser beam 2 according to transmissivity of the wavelength filter 4 that varies according to the wavelength of the signal laser beam 2. Reference numeral 5 indicates a first photodiode (or a first photodetector) for detecting an intensity of the signal laser beam 2 transmitting through the wavelength filter 4. Reference numeral 6 indicates a second photodiode (or a second photodetector) for directly detecting an intensity of the signal laser beam 2 collimated by the lens 3. The lens 3, the wavelength filter 4, the first photodiode 5 and the second photodiode 6 can be arranged on a base carrier 11, and the semiconductor laser 1 can be mounted on a chip carrier 50 placed on the base carrier 11. Also, reference numeral 9 indicates a thermister (or a temperature detecting unit) that can be included and can be arranged on the base carrier 11 in the vicinity of the semiconductor laser 1. The base carrier 11 can be arranged on a constant-temperature-keeping device 10 (for example, a Peltier device). The semiconductor laser device 100 shown in FIG. 1 can be arranged in a package (not shown).

In FIG. 1, a propagation direction of the signal laser beam 2 is defined as a Z direction (the right direction on a horizontal plane in FIG. 1), a semiconductor laser mounting direction (the upper direction perpendicular to the horizontal plane) directed from the chip carrier 50 to the semiconductor laser 1 is defined as a Y direction, and a direction (directed perpendicular out of the page) perpendicular to the Y and Z directions is defined as an X direction. In the semiconductor laser 1, two cladding layers (not shown) and an active layer (not shown) placed between the cladding layers are stacked in the Y direction.

Next, an exemplary operation of the semiconductor laser device will be described. A spreading angle of the signal laser beam 2 emitted from the semiconductor laser 1 is adjusted in the lens 3 to collimate the signal laser beam 2. Thereafter, a lower half part of the signal laser beam 2 transmits through the wavelength filter 4 and is received by the first photodiode 5. Also, the other upper half part of the signal laser beam 2 transmitting through the lens 3 is directly received in the second photodiode 6 without passing through the wavelength filter 4. Because the wavelength filter 4 has a transmissivity that depends on the wavelength of an incident laser beam, the intensity of the signal laser beam 2 transmitted through the wavelength filter 4 varies according to the wavelength of the signal laser beam 2. Therefore, an output of electric current in the first photodiode 5 changes with the wavelength of the signal laser beam 2. In this embodiment, the output of electric current in the first photodiode 5 is used as a wavelength monitored output.

Also, because the second photodiode 6 directly receives the signal laser beam 2 collimated by the lens 3 without passing through the wavelength filter 4, the output of electric current in the second photodiode 6 is not changed in dependence on the wavelength of the signal laser beam 2, but is changed with the intensity of the signal laser beam 2 emitted from the semiconductor laser 1. Therefore, the output of electric current in the second photodiode 6 is used as an intensity monitored output.

Also, because the signal laser beam 2 is collimated by the lens 3, even if a position of photodiode 5 or 6 is shifted from an optical axis of the optical system, the signal laser beam 2 transmitting through the wavelength filter 4 will not be received by the second photodiode 6. Therefore, a distance between the first and second photodiodes 5 and 6 can be shortened. In this embodiment, two beam receiving faces of the first and second photodiodes 5 and 6 are arranged on a photodiode substrate so as to be adjacent to each other.

Figure 2:
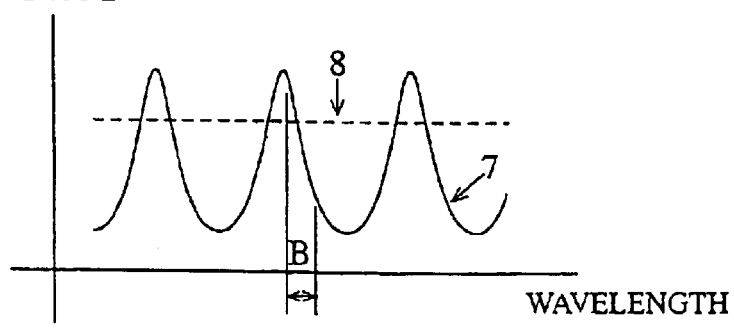
FIG. 2 shows a relationship between the output of electric current and the wavelength of a laser beam.

A Fabry-Perot resonator, for example, can be used as the wavelength filter 4. The Fabry-Perot resonator can be formed by depositing a mirror on a surface of a glass substrate polished so as to make the mirror parallel to the surface of the glass substrate. FIG. 2 shows an exemplary relationship between the output of electric current from the first photodiode 5 and the wavelength of the laser beam emitted from the semiconductor laser 1 in cases where a Fabry-Perot resonator is used as the wavelength filter 4. In FIG. 2, a solid line 7 indicates a waveform of the output of electric current generated by the first photodiode 5, and a dotted line 8 indicates the output of electric current generated by the second photodiode 6.

As shown in FIG. 2, the output of electric current from photodiode 5 due to the laser beam transmitting through the Fabry-Perot resonator is periodically increased or decreased with the wavelength of beam incident on the Fabry-Perot resonator. For example, in cases where a wavelength of a laser beam incident on the Fabry-Perot resonator is lengthened within a specific wavelength band B, the output of electric current generated by the first photodiode 5 is sharply decreased. Therefore, in cases where the semiconductor laser 1 emits a laser beam for which the variation in wavelength corresponds to the specific wavelength band B, variations in wavelength of the laser beam 2 emitted from the semiconductor laser 1 can be precisely detected and monitored because the output of electric current obtained in the first photodiode 5 sharply changes with the wavelength of the laser beam 2.

In this embodiment, the specific wavelength band B can be set such that the output of electric current generated by the first photodiode 5 decreases as the wavelength of the laser beam 2 emitted from the semiconductor laser 1 is increased. Alternatively, the specific wavelength band B can be set such that the output of electric current generated by the first photodiode 5 sharply increases in cases where a wavelength of a laser beam incident on the Fabry-Perot resonator is increased. In addition, a table indicating a relationship between the output of electric current generated by the first photodiode 5 and wavelength of a laser beam can be stored in a memory (not shown). Such a table can be generated by actually measuring the output of electric current generated by the first photodiode 5 in advance while changing the wavelength of a laser beam. In this case, it is possible to measure the wavelength of the laser beam 2 emitted from the semiconductor laser 1 according to the output of electric current obtained in the first photodiode 5 by referring to the table stored in the memory.

In contrast, as shown by the dotted line 8 indicating the output in the second photodiode 6, because the portion of the laser beam 2 not transmitted through the wavelength filter 4 is detected by the second photodiode 6, the output in the second photodiode 6 does not change even if the wavelength of the laser beam 2 emitted from the semiconductor laser 1 changes.

In this embodiment, the wavelength filter 4 is not limited to a Fabry-Perot resonator. Any appropriate filter can be used as the wavelength filter 4 on the condition that an intensity of a laser beam transmitting through the filter is changed in dependence on the wavelength of the laser beam. For example, an optical band pass filter obtained by depositing a plurality of dielectric films on a glass substrate can be used as the wavelength filter 4. Also, a filter composed of a pair of birefringent crystals and a polarizer can be used as the wavelength filter 4.

Also, this embodiment is not limited to a configuration wherein the wavelength filter 4 receives a portion of the laser beam 2. For example, a wavelength filter composed of a first block having a wavelength-dependent transmissivity and a second block having no wavelength-dependent transmissivity can be used. In this case, the whole signal laser beam 2 can be received by the wavelength filter.

Next, a method of controlling the semiconductor laser 1 to stabilize the wavelength of the laser beam emitted from the semiconductor laser 1 is described.

Figure 3:
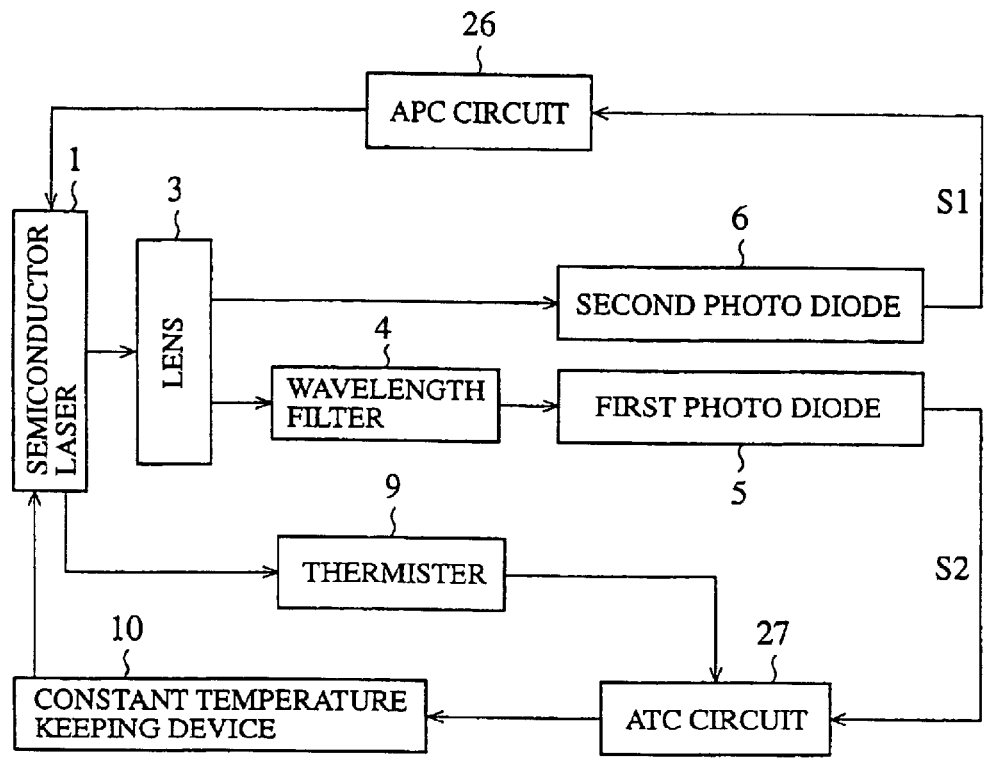
FIG. 3 is a block diagram of a wavelength division multiplexing type semiconductor laser device.

FIG. 3 is a block diagram of an exemplary wavelength division multiplexing (WDM) type semiconductor laser device. A method of controlling the semiconductor laser 1 is performed using a wavelength monitor applied to the WDM type semiconductor laser device. In this type of wavelength monitor, a control operation for setting an intensity of the laser beam 2 to a constant value is performed using an automatic power control (APC) circuit 26, and the temperature of the semiconductor laser 1 is controlled to be set to a constant value using an automatic temperature control (ATC) circuit 27. In the APC circuit 26, a driving current supplied to the semiconductor laser 1 is adjusted according to the output of electric current generated by the second photodiode 6, so that an intensity of the forward laser beam emitted from the semiconductor laser 1 is set to a constant value. Also, in the ATC circuit 27, a current supplied to the constant-temperature-keeping device 10, such as a Peltier device, is adjusted according to a resistance value of the thermister 9 arranged in the neighborhood of the semiconductor laser 1. The resistance value of the thermister 9 indicates a temperature of the semiconductor laser 1. Of course, an appropriate temperature detecting unit other than a thermister can also be used.

In the WDM type semiconductor laser device using the wavelength monitor, an intensity of the forward laser beam emitted from the semiconductor laser 1 is set to a setting value by the APC circuit 26 according to the output of electric current generated by the second photodiode 6. For example, in cases where the output of electric current generated by the second photodiode 6 is larger than a setting output, a drive current supplied to the semiconductor laser 1 is lowered by the APC circuit 26. In contrast, in cases where the output of electric current generated by the second photodiode 6 is smaller than a setting output, a drive current supplied to the semiconductor laser 1 is increased by the APC circuit 26. Also, the temperature of the semiconductor laser 1 is adjusted to a setting temperature by the ATC circuit 27 according to a resistance value of the thermister 9. Also, the setting temperature in the ATC circuit 27 is further adjusted according to the output of electric current generated by the first photodiode 5 to keep the output of electric current generated by the first photodiode 5 to a setting value. Accordingly, the wavelength of the forward laser beam emitted from the semiconductor laser 1 can be stabilized to a preset wavelength. For example, in cases where the wavelength of the signal laser beam 2 emitted from the semiconductor laser 1 is set within the specific wavelength band B, when the output of electric current generated by the first photodiode 5 is larger than a setting output, it is determined that the wavelength of the signal laser beam 2 is shorter than the preset wavelength. Therefore, the setting temperature in the ATC circuit 27 is increased to lengthen the wavelength of the signal laser beam 2 emitted from the semiconductor laser 1. In contrast, when the output of electric current obtained in the first photodiode 5 is smaller than a setting output, it is determined that the wavelength of the signal laser beam 2 is longer than the preset wavelength. Therefore, the setting temperature in the ATC circuit 27 is decreased to shorten the wavelength of the signal laser beam 2 emitted from the semiconductor laser 1. That is, the output of electric current generated by the first photodiode 5 is fed back to the ATC circuit 27 without inverting the output of electric current obtained in the first photodiode 5.

In the first embodiment shown in the example of FIG. 1, the signal laser beam 2 is divided into the upper half part of the beam not incident on the wavelength filter 4 and the lower half part of the beam incident on the wavelength filter 4 along the Y direction. However, if the alignment between the semiconductor laser 1 and the first and second photodiodes 5 and 6 is performed with high precision, the signal laser beam 2 can be divided into two parts along the X direction. Also, the signal laser beam 2 can be divided into two parts at an arbitrary ratio as long as the output of electric current generated by the first photodiode 5 is appropriately used to monitor the wavelength of the laser beam 2 and as long as the output of electric current generated by the second photodiode 6 is appropriately used to monitor the intensity of the laser beam 2.

Also, in the first embodiment shown in the example of FIG. 1, the signal laser beam 2 emitted from the semiconductor laser 1 is collimated by the lens 3. However, this embodiment is not limited to collimation by the lens 3. The signal laser beam 2 emitted from the semiconductor laser 1 can alternatively either be converged or diverged by the lens 3 as long as the part of the laser beam not transmitted through the wavelength filter 4 is not received by the first photodiode 5 and as long as the part of the laser beam transmitted through the wavelength filter 4 is not received by the second photodiode 6. Also, it is possible for no lens to be arranged in the exemplary semiconductor laser device shown in FIG. 1.

Accordingly, an intensity and varying wavelength of the laser beam emitted from the semiconductor laser 1 can be correctly monitored by arranging the lens 3, the wavelength filter 4 and the first and second photodiodes 5 and 6 along one optical axis. Also, because a combination of a plurality of polarized beam splitters and a plurality of band pass filters is not used, the semiconductor laser device including the wavelength monitor can be easily manufactured, and a manufacturing cost of the semiconductor laser device including the wavelength monitor can be reduced.

Embodiment 2

Figure 4:
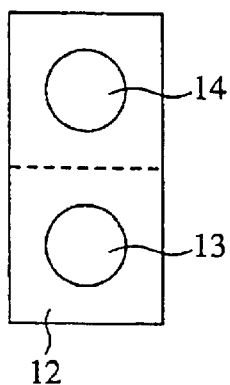
FIG. 4 shows a plan view of two beam receiving faces of a monolithic photodiode according to a second embodiment.

FIG. 4 shows a plan view of two beam receiving faces of an exemplary monolithic photodiode device 12 according to a second embodiment. As shown in FIG. 4, the monolithic photodiode device 12 can be arranged in place of the first and second photodiodes 5 and 6. The monolithic photodiode device 12 is obtained by forming two beam receiving faces 13 and 14 on a monolithic photodiode substrate.

Accordingly, the arrangement of the first and second photodiodes 5 and 6 can be performed at one time by arranging the monolithic photodiode on the base carrier 11, and a manufacturing cost of the semiconductor laser device including the wavelength monitor can be further reduced.

Embodiment 3

Figure 5:
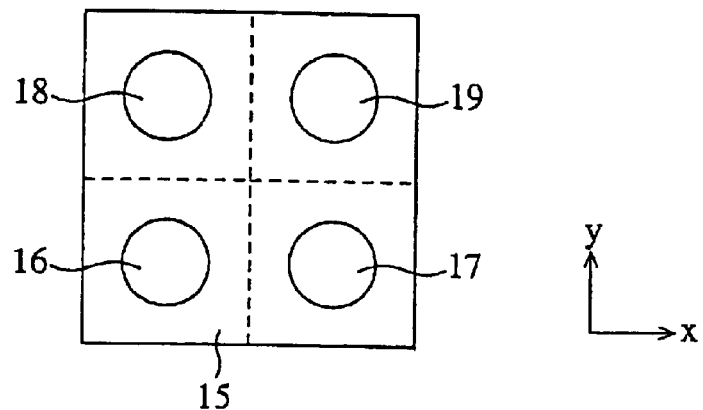
FIG. 5 shows a plan view of beam receiving faces of four photodiodes of a monolithic photodiode device according to a third embodiment.

FIG. 5 shows a plan view of beam receiving faces of four photodiodes of an exemplary monolithic photodiode device 15 according to a third embodiment. As shown in FIG. 5, the monolithic photodiode device 15 is arranged in place of the first and second photodiodes 5 and 6. The monolithic photodiode device 15 is obtained by forming beam receiving faces of four photodiodes 16 to 19 on a monolithic photodiode substrate. The photodiodes 18 and 19 functioning as the second photodiode 6 are placed adjacent to photodiodes 16 and 17 functioning as the first photodiode 5. The photodiodes 16 and 17 are arranged adjacent to each other in the X direction, and the photodiodes 18 and 19 are arranged adjacent to each other in the X direction.

In the first embodiment, to sufficiently receive portions of the signal laser beam 2 emitted from the semiconductor laser 1 on both the first and second photodiodes 5 and 6, it is necessary to precisely align the first and second photodiodes 5 and 6 with the semiconductor laser 1 along the optical axis. As shown in FIG. 1, because the semiconductor laser 1, the lens 3 and the first and second photodiodes 5 and 6 are arranged on the base carrier 11 or the chip carrier 50, the arrangement precision of the first and second photodiodes 5 and 6 in the semiconductor laser mounting direction (the Y direction in FIG. 1) is comparatively high. However, the semiconductor laser 1 and the first and second photodiodes 5 and 6 are typically fixed to the base carrier 11 or the chip carrier 50 using solder or adhesive agent. Therefore, when the temperature of the base carrier 11 or the chip carrier 50 is increased during the manufacturing of the semiconductor laser device, there is a possibility that positions of the semiconductor laser 1 and the first and second photodiodes 5 and 6 can lose proper alignment. Therefore, the arrangement precision of the first and second photodiodes 5 and 6 can deteriorate in a direction (the X direction in FIG. 1) perpendicular to the semiconductor laser mounting direction.

To solve this potential problem, in the third embodiment, the beam receiving area of photodiodes, upon which the laser beam emitted from the semiconductor laser 1 is received, is enlarged in the X direction. That is, the signal laser beam 2 transmitting through the wavelength filter 4 is received on beam receiving faces of two photodiodes 16 and 17 functioning as the first photodiode 5, and the signal laser beam 2 not transmitting through the wavelength filter 4 is received on beam receiving faces of two photodiodes 18 and 19 functioning as the second photodiode 6. Because a first group of photodiodes 18 and 19 and a second group of photodiodes 16 and 17 respectively extend in the X direction, even though the signal laser beam 2 emitted from the semiconductor laser 1 is shifted in the X direction, a decrease of the output of electric current generated by each group of photodiodes can be avoided.

Accordingly, in the third embodiment, the precision of the X-directional arrangement of the semiconductor laser 1, the lens 3, the first group of photodiodes 18 and 19 and the second group of photodiodes 16 and 17 can have lower minimum requirement. For example, when a positional relationship among the semiconductor laser 1, the lens 3, the first group of photodiodes 18 and 19 and the second group of photodiodes 16 and 17 is proper in the X direction, the intensity and wavelength of the laser beam emitted from the semiconductor laser 1 is controlled according to the outputs of electric current obtained in the photodiodes 16 and 17 and the outputs of electric current obtained in the photodiodes 18 and 19, respectively. If the positional relationship deteriorates, the intensity and wavelength of the laser beam emitted from the semiconductor laser 1 is controlled according to a sum of the outputs of electric current generated by the photodiodes 16 and 17 and a sum of the outputs of electric current generated by the photodiodes 18 and 19. Therefore, the photodiodes 16 to 19 of the monolithic photodiode device 15 can compensate for potential deterioration of the X-directional precision in the placement of components for the monitoring of the intensity and varying wavelength of the laser beam, and the precision of the X-directional arrangement can have lower minimum requirement.

Also, in cases where the arrangement precision required for the semiconductor laser device is very high, it is preferred that the number of photodiodes arranged adjacent to each other in the X direction is increased. In this case, the precision of the X-directional arrangement can have lower minimum requirement.

In addition, the semiconductor laser device can alternatively be configured such that the signal laser beam 2 is divided in the Y direction by the wavelength filter 4. In this case, the signal laser beam 2 not transmitting through the wavelength filter 4 is received by a first group of the photodiodes 17 and 19 arranged adjacent to each other in the Y direction, and the laser beam 2 transmitting through the wavelength filter 4 is received by a second group of the photodiodes 16 and 18 arranged adjacent to each other in the Y direction. Even if the laser beam 2 emitted from the semiconductor laser 1 is shifted in the Y direction, because the beam receiving faces of each group of the photodiodes extend in the Y direction, the photodiodes 16 to 19 of the monolithic photodiode device 15 can compensate for potential deterioration of the Y-directional precision in the placement of components for the monitoring of the intensity and varying wavelength of the signal laser beam 2, and the precision of the Y-directional arrangement can have a lower minimum requirement. Also, in cases where the Y-directional arrangement precision required for the semiconductor laser device is very high, it is preferred that the number of photodiodes arranged adjacent to each other in the Y direction is increased for each group of photodiodes. In this case, the precision of the Y-directional arrangement can have lower minimum requirement.

Embodiment 4

Figure 6:
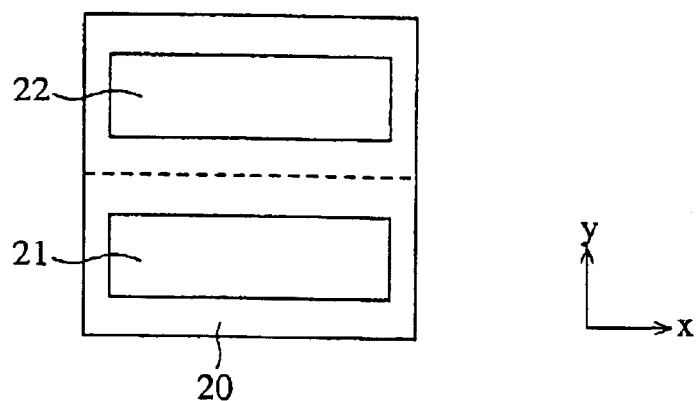
FIG. 6 shows a plan view of two laterally-lengthened beam receiving faces of two photodiodes of a monolithic photodiode device according to a fourth embodiment.

FIG. 6 shows a plan view of laterally-lengthened beam receiving faces of two photodiodes of an exemplary monolithic photodiode device 20 according to a fourth embodiment. As shown in FIG. 6, the monolithic photodiode device 20 is arranged in place of the first and second photodiodes 5 and 6. The monolithic photodiode device 20 is obtained by forming beam receiving faces of two photodiodes 21 to 22 respectively lengthened in the X direction on a monolithic photodiode substrate. The photodiode 22 functioning as the second photodiode 6 is placed adjacent to the photodiode 21 functioning as the first photodiode 5.

Accordingly, in the fourth embodiment, because the beam receiving faces of the photodiodes 21 to 22 are lengthened in the X direction, even though the laser beam 2 emitted from the semiconductor laser 1 is shifted in the X direction, the beam receiving faces of the photodiodes 21 to 22 laterally-lengthened in the X direction can reliably receive the laser beam 2. Therefore, the beam receiving faces of the photodiodes 21 to 22 of the monolithic photodiode device 20 can compensate for potential deterioration of the X-directional precision in the placement of components for the monitoring of the intensity and varying wavelength of the laser beam, and the precision of the X-directional arrangement can have lower minimum requirement.

Also, in cases where the arrangement precision required for the semiconductor laser device is very high, it is preferred that the beam receiving faces of the photodiodes 21 and 22 are further lengthened in the X direction. In this case, the precision of the X-directional arrangement can have lower minimum requirement.

Also, in cases where the arrangement precision can be satisfied in the X direction, the wavelength filter 4 can be placed on the right side (or the left side) of the optical axis in a plane parallel to the X-Y plane. In this case, a monolithic photodiode device replacing the first and second photodiodes 5 and 6 of the first embodiment has longitudinally-lengthened beam receiving faces of two photodiodes arranged adjacent to each other in the X direction, and the beam receiving face of each photodiode extends in the Y direction. Also, the portion of the laser beam transmitting through the wavelength filter 4 is received by one photodiode placed on the right side (or the left side) in a plane parallel to the X-Y plane, and the portion of the laser beam not transmitting through the wavelength filter 4 is received by the other photodiode placed on the left side (or the right side) in the plane parallel to the X-Y plane. Therefore, even if the laser beam 2 emitted from the semiconductor laser 1 is shifted in the Y direction, because the beam receiving face of each photodiode extends in the Y direction, the photodiodes of the monolithic photodiode device can compensate for potential deterioration of the Y-directional precision in the placement of components for the monitoring of the intensity and varying wavelength of the laser beam, and the arrangement precision of the semiconductor laser 1, the lens 3 and the photodiodes 5 and 6 in the Y direction can have lower minimum requirement. Also, in cases where the arrangement precision required for the semiconductor laser device is very high, it is preferred that the beam receiving face of each photodiode is further lengthened in the Y direction. In this case, the precision of the Y-directional arrangement can have lower minimum requirement.

Embodiment 5

Figure 7:
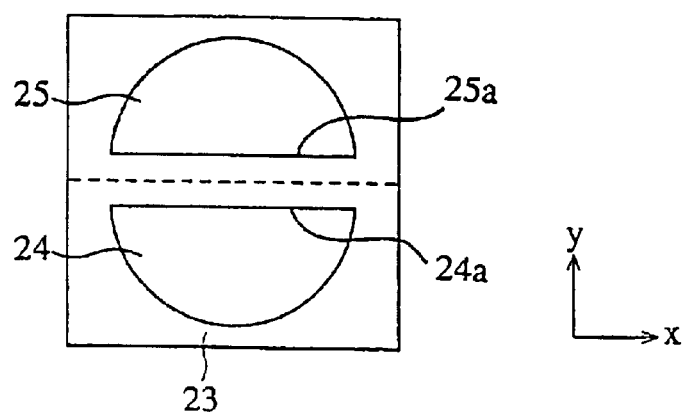
FIG. 7 shows a plan view of semicircular beam receiving faces of two photodiodes of a monolithic photodiode device according to a fifth embodiment.

FIG. 7 shows a plan view of semicircular beam receiving faces of two photodiodes of a monolithic photodiode device according to a fifth embodiment. As shown in FIG. 7, a monolithic photodiode device 23 is arranged in place of the first and second photodiodes 5 and 6. The monolithic photodiode device 23 is obtained by forming semicircular beam receiving faces of two photodiodes 24 and 25 on a monolithic photodiode substrate. The photodiode 25 functioning as the second photodiode 6 of the first embodiment is placed adjacent to the photodiode 24 functioning as the first photodiode 5 of the first embodiment. The beam receiving faces of the photodiode have chord edges 24a and 25a extending in the X direction perpendicular to both the optical axis (Z direction) and the photodiode arranging direction (Y direction), and the chord edges 24a and 25b of the photodiodes 24 and 25 face each other. Therefore, a group of the photodiodes 24 and 25 of the monolithic photodiode device 23 is formed approximately in a circular shape. Because the laser beam emitted from the semiconductor laser 1 is formed approximately in a circular shape, the shape of the laser beam approximately matches the shape of the beam receiving faces of the photodiodes 24 and 25. Therefore, the signal laser beam 2 emitted from the semiconductor laser 1 can be efficiently received by the beam receiving faces of the photodiodes 24 and 25 of the monolithic photodiode device 23.

In this embodiment, the beam receiving face of each photodiode can alternatively be formed in a half-elliptical shape lengthened in the X direction. In this case, the arrangement precision of the semiconductor laser 1, the lens 3 and the photodiodes 24 and 25 in the X direction can have lower minimum requirement in the same manner as in the fourth embodiment shown in the example of FIG. 6.

Also, in cases where the arrangement precision can be satisfied in the X direction, the wavelength filter 4 can alternatively be placed on the right side (or the left side) of the optical axis in a plane parallel to the X-Y plane. In this case, a monolithic photodiode device replacing the first and second photodiodes 5 and 6 of the first embodiment has half-elliptical beam receiving faces of two photodiodes arranged adjacent to each other in the X direction, and chords of the half-elliptical beam receiving faces of the photodiodes extend in the Y direction and face each other. Also, the portion of the signal laser beam 2 transmitting through the wavelength filter 4 is received by the half-elliptical beam receiving face of one photodiode placed on the right side (or the left side) in a plane parallel to the X-Y plane, and the portion of the signal laser beam 2 not transmitting through the wavelength filter 4 is received by the half-elliptical beam receiving face of the other photodiode placed on the left side (or the right side) in the plane parallel to the X-Y plane. Therefore, the arrangement precision of the semiconductor laser 1, the lens 3 and the photodiodes in the Y direction can have lower minimum requirement. Therefore, even if the laser beam 2 emitted from the semiconductor laser 1 is shifted in the Y direction, because the beam receiving face of each photodiode extends in the Y direction, the photodiodes of the monolithic photodiode device can compensate for potential deterioration of the Y-directional precision in the placement of components for the monitoring of the intensity and varying wavelength of the laser beam, and the arrangement precision of the semiconductor laser 1, the lens 3 and the photodiodes in the Y direction can have lower minimum requirement. Also, in cases where the arrangement precision required for the semiconductor laser device is very high, it is preferred that the half-elliptical beam receiving faces of the photodiodes are further lengthened in the Y direction. In this case, the arrangement precision in the Y direction can have lower minimum requirement.

Embodiment 6

Figure 8:
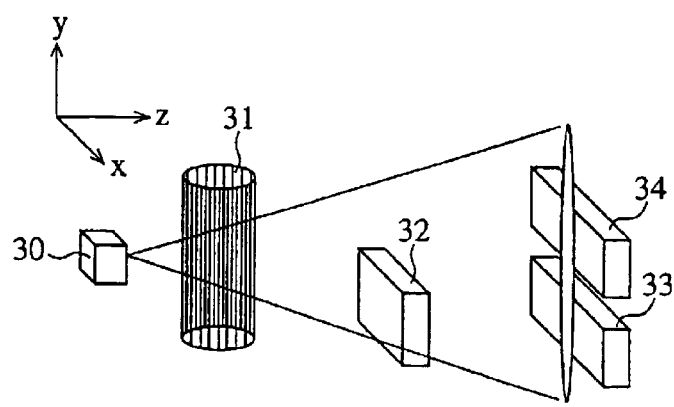
FIG. 8 is an upper-oblique view of a wavelength monitor according to a sixth embodiment of the present invention.

FIG. 8 is an upper-oblique view of an exemplary wavelength monitor comprising a drum lens 31, a wavelength filter 32, and first and second photodiodes 33 and 34 according to a sixth embodiment of the present invention. The wavelength monitor can be used to monitor the wavelength of a laser beam emitted from a laser, such as semiconductor 30. In addition, the wavelength monitor can be used in conjunction with a semiconductor laser device such as illustrated in FIG. 1 or FIG. 3, in which case drum lens 31, wavelength filter 32, photodiodes 34 and 35, and semiconductor laser 30 replace the corresponding components shown in FIG. 1 or FIG. 3. The remaining constituent elements of the semiconductor laser device can be the same as those shown in FIG. 1 or FIG. 3, and additional description of those constituent elements is omitted. The same is applicable for the seventh through the tenth embodiments.

The semiconductor laser 30 can be, for example, a distributed feedback type laser having a diffraction grating in an active layer, a wavelength variable laser diode from which a signal laser beam having a wavelength depending on an input current or temperature is emitted, or a composite semiconductor laser which is composed of an electric absorption device and a laser diode serially arranged. Also, the semiconductor laser 30 can be arranged relative to other components in the same manner as the semiconductor laser 1 shown in FIG. 1. The drum lens 31 (also referred to as a cylindrical lens) is formed in a cylindrical shape for converging a backward laser beam (also referred to as a signal laser beam) emitted from the semiconductor laser 30. The drum lens 31 can be placed at the rear side of the semiconductor laser 30, and a longitudinal direction (a center axis direction) of the drum lens 31 can be oriented along a vertical direction (the Y direction in FIG. 8). A laser beam incident on the drum lens 31 is converged in a direction (the X direction in FIG. 8) perpendicular to both the longitudinal direction and a direction of an optical axis (the Z direction in FIG. 8), but the laser beam incident on the drum lens 31 is not converged in the longitudinal direction. That is, the drum lens 31 has a uniaxial converging function to uniaxially converge a laser beam. Therefore, the signal laser beam converged by the drum lens 31 is formed in an elliptical shape on an X-Y plane. In other words, the signal laser beam is lengthened in the Y direction and is shortened in the X direction as illustrated in FIG. 8.

The wavelength filter 32 can have a wavelength-dependent transmissivity. That is, when the wavelength filter 32 receives a lower half part of the signal laser beam uniaxially converged by the drum lens 31, the transmissivity of the wavelength filter 32 for the signal laser beam depends upon the wavelength of the signal laser beam. Accordingly, an intensity of the signal laser beam is changed in the wavelength filter 32 according to the wavelength of the signal laser beam. Therefore, the intensity of the signal laser beam transmitting through the wavelength filter 32 is changed with variations in wavelength of the signal laser beam emitted from the semiconductor laser 30. The wavelength filter 32 can be, for example, formed of a Fabry-Perot resonator in the same manner as in the first embodiment. However, any appropriate wavelength filter can be used as the wavelength filter 32 if the wavelength filter has a function of changing an intensity of a beam at a certain rate (e.g., has changing transmissivity) depending on a wavelength of the incident laser beam. For example, an etalon filter of an interference type, a birefringence filter composed of $YVO_4$ crystal, $LiNbO_3$ crystal and a polarizer (or a polarized beam splitter) or a thin film filter having a plurality of coated layers on a glass substrate can be used as the wavelength filter 32.

As illustrated in FIG. 8, a first photodiode 33 (or a first photodetector) is laterally lengthened in a direction perpendicular to the longitudinal direction (the X direction in FIG. 8). The first photodiode 33 receives a lower half part of the signal laser beam which is uniaxially converged by the drum lens 31 and transmitted through the wavelength filter 32, and an intensity of the signal laser beam can be monitored by the first photodiode 33 in the form of a current value. A second photodiode 34 (or a second photodetector) is also laterally lengthened in the X direction. The second photodiode 34 receives an upper half part of the signal laser beam which is uniaxially converged by the drum lens 31 and which is not transmitted through the wavelength filter 32, and an intensity of the signal laser beam can be monitored by the second photodiode 34 in the form of a current value. To receive the signal laser beam, which is formed in an elliptical shape by the drum lens 31, the second photodiode 34 is preferably arranged above the first photodiode 33 such that the photodiodes 33 and 34 are parallel to each other with respect to the lengthwise direction of each photodiode 33 and 34. A sum of lengths of the photodiodes 33 and 34 in the Y direction is sufficiently lower than a beam diameter of the signal laser beam in the Y direction, and a length of each photodiode in the X direction is sufficiently longer than a beam diameter of the signal laser beam in the X direction (refer also to FIG. 11A).

Also, the photodiodes 33 and 34 are preferably arranged symmetrically with respect to the optical axis, which is placed in the beam center of the signal laser beam. Also, the drum lens 31, the wavelength filter 32 and the pair of photodiodes 33 and 34 can be fixedly arranged on a base carrier (not shown) in the same manner as in the first embodiment. For example, the drum lens 31 can be fixed to the base carrier by using an alloy of gold and tin or a glass with a low melting point.

In this embodiment, the second photodiode 34 monitors the intensity of the signal laser beam emitted from the semiconductor laser 30. Therefore, the second photodiode 34 functions as a power monitor photodiode. Also, because the intensity of the signal laser beam transmitted through the wavelength filter 32 depends on the wavelength of the signal laser beam incident on the wavelength filter 32, the intensity of the signal laser beam monitored by the first photodiode 33 can vary according to the wavelength of the signal laser beam emitted from the semiconductor laser 30. Therefore, the first photodiode 33 functions as a wavelength monitor photodiode. Of course, the roles of the photodiodes could be reversed if the wavelength filter 32 in FIG. 8 is positioned to receive an upper portion of the signal laser beam.

Figure 9:
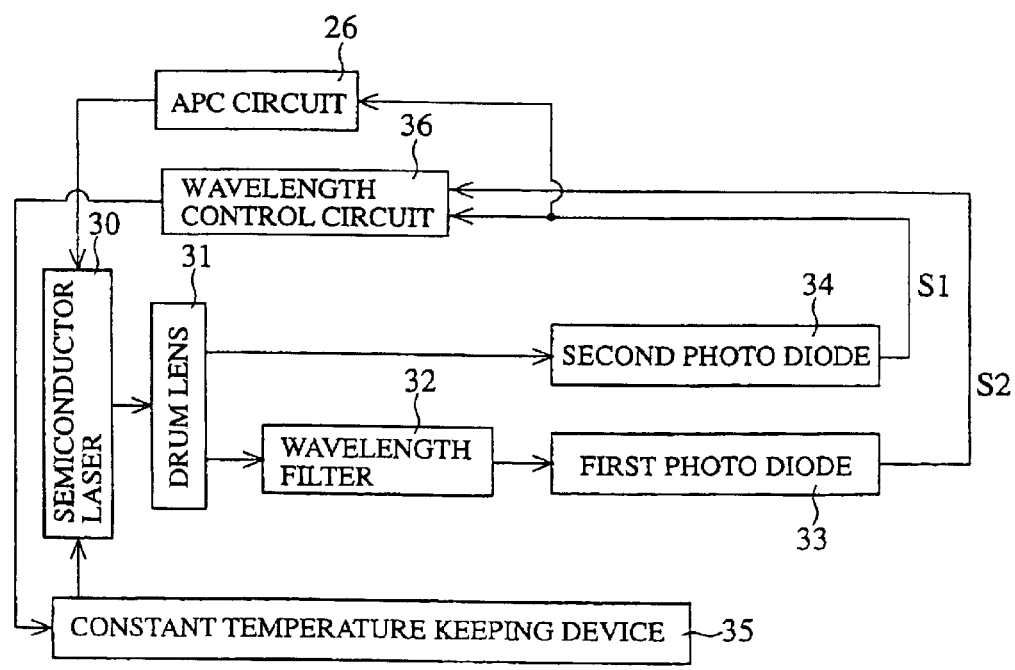
FIG. 9 is a block diagram of a wavelength control system of the wavelength monitor shown in FIG. 8.

FIG. 9 is a block diagram of an exemplary wavelength control system of the wavelength monitor shown in FIG. 8. In FIG. 9, reference numeral 35 indicates a constant temperature keeping device (for example, a Peltier device)

making contact with the semiconductor laser 30 through the base carrier (not shown). Heat can be transferred between the constant-temperature-keeping device 35 and given to the semiconductor laser 30 according to thermal conduction through the base carrier.

Reference numeral 36 indicates a wavelength control circuit. In the wavelength control circuit 36, a ratio S2/S1 of an intensity S2 monitored by the first photodiode 33 to an intensity S1 monitored by the second photodiode 34 is calculated, and it is judged according to the ratio S2/S1 and according to a preset reference signal intensity ratio whether a wavelength of the signal laser beam emitted from the semiconductor laser 30 is shorter or longer than the preset wavelength. Also, the heat generated in the constant temperature keeping device 35 can be adjusted under the control of the wavelength control circuit 36 to adjust the temperature of the semiconductor laser 30 for the purpose of controlling the wavelength of the signal laser beam emitted from the semiconductor laser 30 to the preset wavelength. In this case, the signal intensity ratio S2/S1 does not depend on an energy level of the signal laser beam emitted from the semiconductor laser 30. Therefore, the signal intensity ratio S2/S1 directly indicates a difference between the wavelength of the signal laser beam and the preset wavelength regardless of whether the intensity of the signal laser beam emitted from the semiconductor laser 30 is controlled to a preset value. That is, in cases where the preset wavelength of the signal laser beam is set within the specific wavelength band B such as shown in FIG. 2, a similar determination as that in the first embodiment is performed in the wavelength control circuit 36. In other words, when the signal intensity ratio S2/S1 is larger than the preset reference signal intensity ratio, it is judged that the wavelength of the signal laser beam emitted from the semiconductor laser 30 is shorter than the preset wavelength. In contrast, when the signal intensity ratio S2/S1 is lower than the preset reference signal intensity ratio, it is judged that the wavelength of the signal laser beam emitted from the semiconductor laser 30 is longer than the preset wavelength.

In this embodiment, the wavelength monitor comprises the drum lens 31 in which the signal laser beam emitted from the semiconductor laser 30 is uniaxially converged, the wavelength filter 32, the first photodiode 33 and the second photodiode 34. A semiconductor laser device comprises the wavelength monitor and the semiconductor laser 30. The semiconductor laser device can further comprise the constant temperature keeping device 35 and a package in which the wavelength monitor, the semiconductor laser 30 and the constant temperature keeping device 35 are arranged. In addition, the semiconductor laser device can further comprise the APC circuit 26, the wavelength control circuit 36 and a substrate on which the semiconductor laser device, the APC circuit 26 and the wavelength control circuit 36 are arranged. In this latter configuration, the semiconductor laser device may also be referred to as an optical transmitter.

Also, the present invention can include another wavelength monitor in which a forward laser beam emitted from the semiconductor laser 30 is transmitted through an optical waveguide such that an output from the optical waveguide is received by the first photodiode 33 and the second photodiode 34 through the drum lens 31. Alternatively, the present invention can include another wavelength monitor in which a forward laser beam emitted from the semiconductor laser 30 is divided by a spectroscope such that a divided laser beam generated by the spectroscope is received by the first photodiode 33 and the second photodiode 34 through the drum lens 31.

Next, an exemplary operation of the wavelength monitor will be described.

As illustrated in FIG. 8, the signal laser beam emitted from the semiconductor laser 30 is uniaxially converged by the drum lens 31. In other words, the signal laser beam is converged in the X direction in FIG. 8, but the signal laser beam is not converged in the Y direction in FIG. 8. Thereafter, an upper part of the uniaxially converged signal laser beam is received by the second photodiode 34, and an intensity S1 of the signal laser beam received is detected and monitored by the second photodiode 34. A difference between the signal laser beam intensity S1 and the reference intensity is calculated in the APC circuit 26 in the same manner as in the first embodiment. Because the signal laser beam intensity S1 indicates an output power of the semiconductor laser 30, a driving current input to the semiconductor laser 30 is adjusted in the APC circuit 26 according to the difference to control the output power of the semiconductor laser 30 to a constant value.

Also, a lower part of the signal laser beam uniaxially converged transmits through the wavelength filter 32, and an intensity of the signal laser beam incident on the wavelength filter 32 is changed at a prescribed rate depending on the wavelength of the signal laser beam. That is, the wavelength filter 32 has a wavelength discrimination characteristic. Thereafter, the signal laser beam transmitting through the wavelength filter 32 is received by the first photodiode 33, and an intensity S2 of the signal laser beam transmitting through the wavelength filter 32 is detected and monitored in the first photodiode 33. A signal intensity ratio S2/S1 is calculated in the wavelength control circuit 36 such as described above. The signal intensity ratio S2/S1 indicates a difference between the wavelength of the signal laser beam and the preset wavelength regardless of the signal laser beam intensity S1. Thereafter, the wavelength control circuit 36 controls the constant temperature keeping device 35 according to the signal intensity ratio S2/S1 and the preset reference signal intensity ratio to adjust the wavelength of the signal laser beam emitted from the semiconductor laser 30 to the preset wavelength by adjusting the temperature of the semiconductor laser 30. Therefore, the wavelength of the signal laser beam emitted from the semiconductor laser 30 can be controlled to a desired wavelength.

A motivation for uniaxially converging the signal laser beam in the drum lens 31 will now be described with reference to FIGS. 10A–10C and FIGS. 11A–11C.

Figures 10A, 10B, 10C:
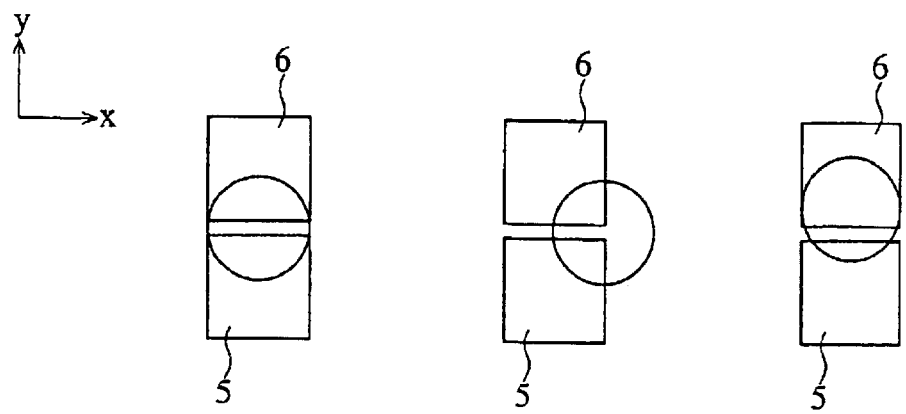
FIG. 10A is an explanatory view showing a circular backward laser beam received in photodiodes in case of no positional shift according to the first embodiment.
FIG. 10B is an explanatory view showing a circular backward laser beam received in photodiodes in case of the movement of the beam in the X direction due to a positional shift according to the first embodiment.
FIG. 10C is an explanatory view showing a circular backward laser beam received in photodiodes in case of the movement of the beam in the Y direction due to a positional shift according to the first embodiment.
Figures 11A, 11B, 11C:
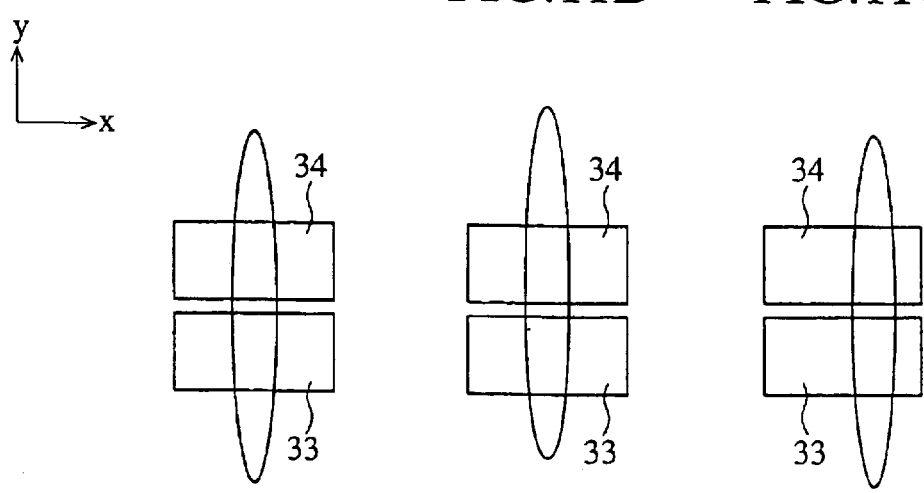
FIG. 11A is an explanatory view showing a longitudinally-lengthened elliptical beam of a signal laser beam wherein there is no positional shift according to the sixth embodiment.
FIG. 11B is an explanatory view showing a longitudinally-lengthened elliptical beam of a signal laser beam wherein there is the movement of the beam in the X direction due to a positional shift according to the sixth embodiment.
FIG. 11C is an explanatory view showing a longitudinally-lengthened elliptical beam of a signal laser beam wherein there is the movement of the beam in the Y direction due to a positional shift according to the sixth embodiment.

FIG. 10A, FIG. 10B and FIG. 10C are explanatory views showing an exemplary circular backward laser beam (signal laser beam), which is emitted from the semiconductor laser 1 and is received in the photodiodes 5 and 6, according to the first embodiment. In particular, FIG. 10A is an explanatory view showing the circular backward laser beam received by the photodiodes 5 and 6 when no shift occurs in the positions of the semiconductor laser 1, the lens 3 and the photodiodes 5 and 6. FIG. 10B is an explanatory view showing the circular backward laser beam which is shifted in the X direction and is received in right-side portions of the photodiodes 5 and 6, and FIG. 10C is an explanatory view showing the circular backward laser beam which is shifted in the Y direction and is received in upper-side portions of the photodiodes 5 and 6. Also, FIG. 11A, FIG. 11B and FIG. 11C are explanatory views showing the longitudinally-lengthened elliptical beam of the signal laser beam, which is emitted from the semiconductor laser 30, uniaxially converged, and directed to the photodiodes 33 and 34, according to the sixth embodiment. In particular, FIG. 11A is an explanatory view showing the longitudinally-lengthened elliptical beam of the signal laser beam received by the photodiodes 33 and 34 when no shift occurs in the positions of the semiconductor laser 30, the drum lens 31 and the photodiodes 33 and 34. FIG. 11B is an explanatory view showing the longitudinally-lengthened elliptical beam of the signal laser beam which is shifted in the Y direction and is received by the photodiodes 33 and 34, and FIG. 11C is an explanatory view showing the longitudinally-lengthened elliptical beam of the signal laser beam which is shifted in the X direction and is received by the photodiodes 33 and 34.

For example, in the first embodiment, a circular laser beam, of which the size is almost equal to or smaller than the beam receiving faces of the photodiodes 5 and 6 arranged in parallel to each other in the Y direction, is, received by the photodiodes 5 and 6 through the lens 3 (refer to FIG. 10A). In cases where the laser beam received by the photodiodes 5 and 6 is slightly moved in the X direction due to a positional shift of an optical element such as the lens 3, a partial area of the beam received by the first photodiode 5 is still equal to that received in the second photodiode 6 (refer to FIG. 10B). Therefore, a decreasing rate of the intensity S2 of the laser beam received in the first photodiode 5 is still equal to a decreasing rate of the intensity S1 of the laser beam received in the second photodiode 6, and the intensity ratio S2/S1 is hardly changed regardless of the slight movement of the laser beam in the X direction. However, in cases where the movement of the laser beam in the X direction exceeds a prescribed extent, the laser beam cannot be sufficiently received by the photodiodes 5 and 6. Therefore, a problem has arisen that the wavelength of the laser beam emitted from the semiconductor laser 1 cannot be controlled.

Also, in cases where the laser beam received in the photodiodes 5 and 6 is moved in the Y direction due to a positional shift of the optical element, a partial area of the beam received by the first photodiode 5 considerably differs from that received by the second photodiode 6 (refer to FIG. 10C). Therefore, the intensity ratio S2/S1 is considerably changed, and a problem has arisen that the wavelength of the laser beam emitted from the semiconductor laser 1 is erroneously adjusted.

To solve these problems, in the sixth embodiment, the drum lens 31 having a converging function in the X direction as shown in FIG. 8 and no converging function in the Y direction is arranged. In this case, a beam diameter of the signal laser beam received in the photodiodes 33 and 34 is shortened in the X direction and is long in the Y direction (refer to FIG. 11A). Therefore, a sum of Y-directional widths of the photodiodes 33 and 34 is sufficiently smaller than the diameter of the laser beam in the Y direction. In this case, even though the laser beam is moved in the Y direction due to a positional shift of an optical element such as the drum lens 31, the signal laser beam can be always received in the photodiodes 33 and 34 (refer to FIG. 11B). Also, because the beam diameter in the Y direction is almost constant in a central portion of the laser beam, an area of the laser beam received by the second photodiode 34 is almost the same as that received by the first photodiode 33, and the signal intensity ratio S2/S1 is almost maintained to a constant value regardless of the movement of the laser beam in the Y direction.

Also, because the photodiodes 33 and 34 each have X-directional widths sufficiently larger than the diameter of the laser beam in the X direction, even if the laser beam is moved in the X direction due to a positional shift of the optical element, the laser beam can be always received in the photodiodes 33 and 34 (refer to FIG. 11C). Therefore, the signal intensity ratio S2/S1 is maintained to a constant value regardless of the movement of the beam in the X direction. Also, even though a positional shift of the optical element occurs in the Z direction, because only a size of the laser beam received in the photodiodes 33 and 34 is slightly changed, the signal intensity ratio S2/S1 is maintained to a constant value.

As a result, even if a positional shift of the optical element such as the semiconductor laser 30, the drum lens 31, the first photodiode 33 or the second photodiode 34 occurs in any direction, the signal intensity ratio S2/S1 is substantially maintained to a constant value. Therefore, the wavelength of the signal laser beam emitted from the semiconductor laser 30 can be accurately and reliably monitored and adjusted regardless of a positional shift of the optical element in any direction.

As described above, in the sixth embodiment, the drum lens 31 is arranged so as to direct the longitudinal direction of the drum lens 31 toward the Y direction as shown in FIG. 8, the signal laser beam emitted from the semiconductor laser 30 is converged in the X direction and is not converged in the Y direction by the drum lens 31, and the photodiodes 33 and 34 respectively laterally-lengthened in the X direction are arranged adjacent to each other in the Y direction. Therefore, the signal laser beam converged in the X direction and not converged in the Y direction is received by the photodiodes 33 and 34 on the condition that the diameter of the laser beam in the Y direction is sufficiently larger than a sum of the Y-directional widths of the photodiodes 33 and 34 and that the diameter of the laser beam in the X direction is sufficiently smaller than the X-directional width of each photodiode. Accordingly, the wavelength of the signal laser beam emitted from the semiconductor laser 30 can be accurately and reliably monitored regardless of a positional shift of an optical element such as the semiconductor laser 30, the drum lens 31, the first photodiode 33 or the second photodiode 34 in any direction. Also, the wavelength of the signal laser beam emitted from the semiconductor laser 30 can be accurately and reliably adjusted according to the monitored wavelength.

Also, the drum lens 31 can be fixed to the base carrier using, for example, an alloy of gold and tin or a glass with a low melting point. Because a melting point of the alloy of gold and tin is higher than that of an alloy of lead and tin or because a melting point of the glass is higher than that of alloy material, even though the temperature of the drum lens 31 or the base carrier is increased in subsequent operations during the manufacturing of the wavelength monitor, the fixing of the drum lens 31 to the base carrier can be maintained. Therefore, there is little probability that a positional shift of the drum lens 31 will occur in subsequent steps during manufacturing. Also, a tensile strength (about 29 kgf/m$^2$) of the alloy of gold and tin is higher than a tensile strength (about 5.6 kgf/mm$^2$) of the alloy of lead and tin. Therefore, there is little probability that a positional shift of the drum lens 31 occurs due to an external mechanical shock given to the wavelength monitor.

In the sixth embodiment, a thermister and an ATC circuit can also be provided. For example, the thermister 9 and the ATC circuit 27 of the first embodiment can be additionally arranged in the same manner as in the first embodiment to control the constant temperature keeping device 35. In this case, the ATC circuit 27 controls the constant temperature keeping device 35 according to a temperature detected in the thermister 9 to keep the temperature of the semiconductor laser 30 to a constant value, and the wavelength control circuit 36 controls the constant temperature keeping device 35 to adjust the temperature of the semiconductor laser 30 for the purpose of adjusting the wavelength of the signal laser beam emitted from the semiconductor laser 30 to the preset wavelength. Therefore, a time constant in the wavelength control circuit 36 is preferably increased as compared with a case where no ATC circuit is arranged, and the wavelength of the signal laser beam emitted from the semiconductor laser 30 can be reliably adjusted against noise.

Also, in the sixth embodiment, the temperature of the semiconductor laser 30 can be adjusted by the constant temperature keeping device 35 to stabilize the wavelength of the signal laser beam emitted from the semiconductor laser 30. However, it is preferable that an auto current control (ACC) circuit be arranged in place of the constant temperature keeping device 35. In this case, the ACC circuit controls a driving current input to the semiconductor laser 30 according to the output of the wavelength control circuit 36 to adjust the wavelength of the signal laser beam emitted from the semiconductor laser 30 to a preset wavelength.

Also, in the sixth embodiment, the signal laser beam emitted from the semiconductor laser 30 is described as being converged in the X direction by the drum lens 31. However, a distance between the semiconductor laser 30 and the drum lens 31 can alternatively be adjusted so as to collimate the signal laser beam transmitted through the drum lens 31 such that a cross section of the signal laser beam in the X-Z plane is collimated along the Z direction (e.g., such that the cross section of the signal laser beam in the X-Z plane emerging from the drum lens 31 has a substantially constant beam width in the X direction). In this case, because laser beams reflected on the photodiodes 33 and 34 are returned within a narrow angle range, it is easy to prevent the reflected laser beams from being returned to the semiconductor laser 30 as a returned laser beam.

Also, in the sixth embodiment, each photodiode 33 and 34 is described as being laterally lengthened in the X direction. However, each photodiode can alternatively be lengthened in the Y direction while maintaining the arrangement wherein photodiode 34 is disposed above photodiode 33. In this case, it is required for the drum lens 31 to further increase the convergence of the signal laser beam in the X direction. This arrangement allows a greater amount of the laser beam to be received by each photodiode, and the wavelength of the signal laser beam emitted from the semiconductor laser 30 can be monitored and adjusted with higher precision.

Figure 12A:
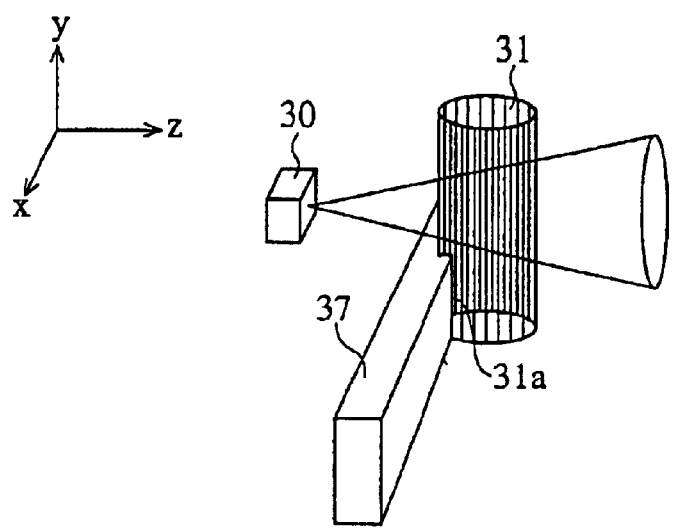
FIG. 12A is an explanatory view showing a positioning structure of a drum lens according to a modification of the sixth embodiment.

In the sixth embodiment as described, there is a possibility that it may be difficult to vertically position the drum lens 31 on the base carrier (not shown). Therefore, as shown in FIG. 12A, a cut-out area 31a can be formed in an edge shape in the vicinity of a lower end surface of the drum lens 31, and a positioning member 37 can be attached to a face of the drum lens 31 in the cut-out area 31a to support and position the drum lens 31. Also, as another method of positioning the drum lens 31, a cut-out groove extending in the Y direction can be formed in the positioning member 37 in a V shape, and a surface of the drum lens 31 can be attached to a groove surface of the cut-out groove. Also, the drum lens 31 can be fixed to the positioning member 37 using, for example, an alloy of gold and tin or a glass with a low melting point.

Figure 12B:
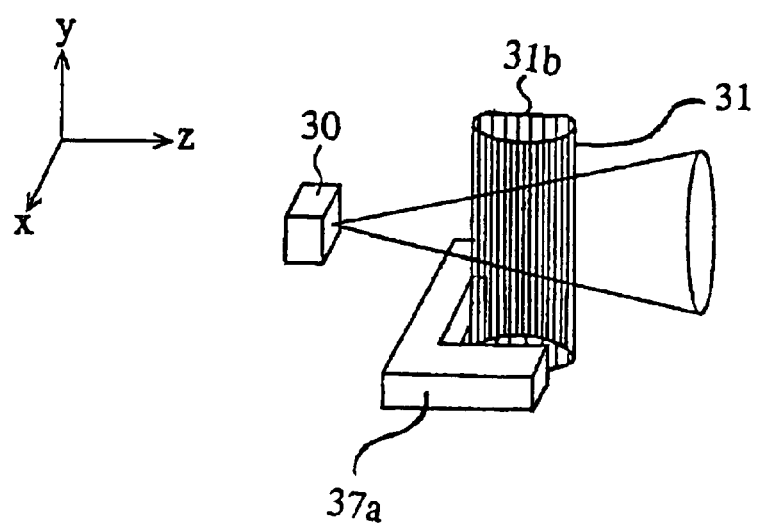
FIG. 12B is an explanatory view showing a positioning structure of a drum lens according to another modification of the sixth embodiment.

Also, as illustrated in FIG. 12B, as another method of positioning the drum lens 31, an L-shaped positioning member 37a can be provided, and a cylindrical surface of the drum lens 31 can be attached to two surfaces of the L-shaped positioning member 37a. In other words, the L-shaped positioning member can contact the cylindrical surface of the cylindrical lens at two locations on the cylindrical lens. In this configuration, it is also advantageous to provide a cut-out surface with a flat portion 31b as shown in FIG. 12B such that the flat portion 31b can be used to assist with orienting the cylindrical lens 31. For example, the cylindrical lens 31 can include antireflection coatings on two surface regions opposite each other and adjacent to the flat portion 31b. The two surface regions with antireflection coatings correspond to locations where the laser beam enters and exits the cylindrical lens such as illustrated in FIG. 12B. The flat portion 31b can be oriented substantially parallel to an optical axis of the semiconductor laser device (e.g., substantially parallel to a direction in which the laser beam is directed through the cylindrical lens 31) so that the laser beam will properly pass through the two surface regions having the antireflection coatings.

Also, in the sixth embodiment, the drum lens 31 is described as being arranged between the semiconductor laser 30 and the wavelength filter 32. However, the drum lens 31 can alternatively be arranged between the wavelength filter 32 and the group of photodetectors 33 and 34 on the condition that the detecting precision of the wavelength of the signal laser beam does not deteriorate in the photodetectors 33 and 34.

Also, in the sixth embodiment, the second photodetector 34 is described as being arranged above the first photodetector 33. However, the second photodetector 34 can alternatively be arranged under the first photodetector 33. In this case, an upper half part of the signal laser beam uniaxially converged by the drum lens 31 is transmitted through the wavelength filter 32 to change the intensity of the signal laser beam.

Also, in the sixth embodiment, beam receiving faces of the photodetectors 33 and 34 are described as being placed on the same plane parallel to the X-Y plane. However, the beam receiving face of the first photodetector 33 need not be placed on the same plane as that of the beam receiving face of the second photodetector 34 on the condition that the beam receiving faces of the photodetectors 33 and 34 are arranged parallel to each other and that both photodetectors 33 and 34 face the semiconductor laser 30.

Also, in the sixth embodiment, because the wavelength of the signal laser beam is adjusted according to the signal laser beam intensity ratio S2/S1, the wavelength adjustment can be performed with high precision regardless of the change of the intensity of the signal laser beam emitted from the semiconductor laser 30. Therefore, the APC circuit 26 is not necessary in view of the wavelength adjustment.

Embodiment 7

Figure 13:
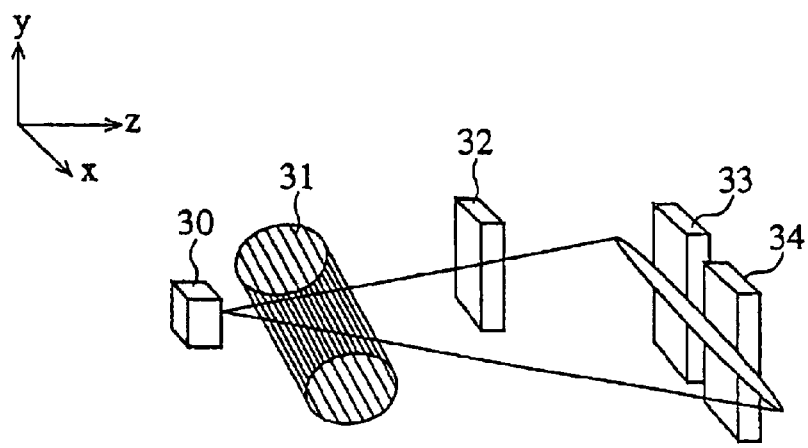
FIG. 13 is an upper-oblique view of a wavelength monitor according to a seventh embodiment of the present invention.

FIG. 13 is an upper-oblique view of an exemplary wavelength monitor according to a seventh embodiment of the present invention. In the sixth embodiment, the drum lens 31 is described as being arranged such that the longitudinal direction of the drum lens 31 is oriented along the Y direction and the photodetectors 33 and 34 are described as being arranged adjacent to each other in the Y direction. However, in the seventh embodiment, the drum lens 31 is arranged such that the longitudinal direction of the drum lens 31 is oriented along the X direction, and the photodetectors 33 and 34 are each longitudinally-lengthened in the Y direction and are arranged adjacent to each other in the X direction. Therefore, the signal laser beam uniaxially converged by the drum lens 31 has a beam formed in a laterally-lengthened elliptical shape. That is, a beam diameter of the signal laser beam is long in the horizontal direction (the X direction) and is shortened in the vertical direction (the Y direction), as shown in FIG. 13. The beam diameter in the X direction is sufficiently longer than a sum of X-directional widths of the photodiodes 33 and 34, and the beam diameter in the Y direction is sufficiently shorter than a Y-directional width of each photodiode.

Because the photodiodes 33 and 34 are arranged adjacent to each other in the X direction, even if a positional shift of the optical element such as the semiconductor laser 30, the drum lens 31, the first photodiode 33 or the second photodiode 34 occurs in any direction, the signal intensity ratio S2/S1 is substantially maintained to a constant value in the same manner as in the sixth embodiment. Therefore, the wavelength of the signal laser beam emitted from the semiconductor laser 30 can be accurately and reliably monitored and adjusted regardless of a positional shift of the optical element in any direction.

As described above, in the seventh embodiment, the drum lens 31 is arranged such that the longitudinal direction of the drum lens 31 is directed along the X direction, the signal laser beam emitted from the semiconductor laser 30 is converged in the Y direction and is not converged in the X direction by the drum lens 31, and the photodiodes 33 and 34 are each longitudinally-lengthened in the Y direction and are arranged adjacent to each other in the X direction. Therefore, the signal laser beam converged in the Y direction and not converged in the X direction is received by the photodiodes 33 and 34 on the condition that the beam diameter in the X direction is sufficiently larger than a sum of the X-directional widths of the photodiodes 33 and 34 and the beam diameter in the Y direction is sufficiently smaller than the Y-directional width of each photodiode. Accordingly, the wavelength of the signal laser beam emitted from the semiconductor laser 30 can be accurately and reliably monitored regardless of a positional shift of an optical element such as the semiconductor laser 30, the drum lens 31, the first photodiode 33 or the second photodiode 34 in any direction. Also, the wavelength of the signal laser beam emitted from the semiconductor laser 30 can be accurately and reliably adjusted according to the monitored wavelength.

Figure 14:
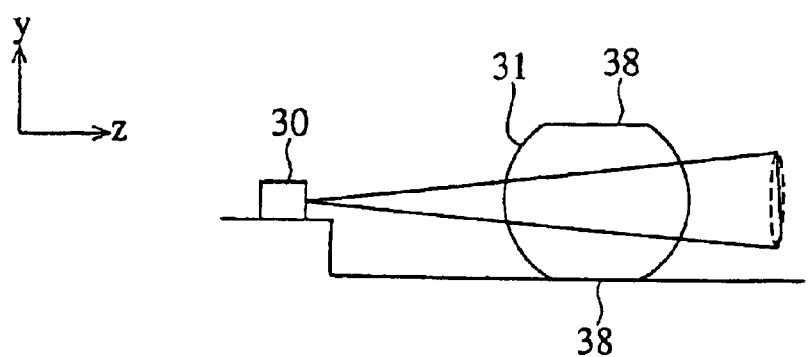
FIG. 14 is a side view of a drum lens in which surfaces are cut out.

In the seventh embodiment, because the curved surface of the drum lens 31 is disposed on the base carrier (not shown), the drum lens 31 can easily roll if not adequately fixed on the base carrier. In addition, it is difficult to fix the drum lens 31 on the base carrier if the curved surface of the drum lens 31 is merely placed on a flat surface of the base carrier. Therefore, as shown in FIG. 14, it is preferred that surfaces of the drum lens 31 are cut out to form two flattened surfaces (also referred to as cut-out surfaces) 38 opposite to each other through the body of the drum lens 31 and that the drum lens 31 is arranged on the base carrier so as to attach one flattened surface 38 of the drum lens 31 to the base carrier. In this case, because an anti-reflection film is generally coated on the surface of the drum lens 31 through which the signal laser beam transmits, the arrangement of the drum lens 31 can be efficiently performed by holding the flattened surfaces 38 on which no anti-reflection film is coated. Also, there is no probability that the anti-reflection film coated on the surface of the drum lens 31 is peeled off.

Also, in the seventh embodiment, the signal laser beam emitted from the semiconductor laser 30 is described as being converged in the Y direction by the drum lens 31. However, a distance between the semiconductor laser 30 and the drum lens 31 can alternatively be adjusted so as to collimate the signal laser beam transmitting through the drum lens 31 such that a cross section of the signal laser beam in the Y-Z plane is collimated along the Z direction (e.g., such that the cross section of the signal laser beam in the Y-Z plane emerging from the drum lens 31 has a substantially constant beam width in the Y direction). In this case, because laser beams reflected on the photodiodes 33 and 34 are returned within a narrow angle range, it is easy to prevent the reflected laser beams from being returned to the semiconductor laser 30 as a returned laser beam.

Also, in the seventh embodiment, each photodiode 33 and 34 is described as being longitudinally lengthened in the Y direction. However, each photodiode can alternatively be lengthened in the X direction while maintaining the side-by-side arrangement of photodiodes 33 and 34. In this case, it is required for the drum lens 31 to further increase the convergence of the signal laser beam in the Y direction. This arrangement allows a greater amount of the signal laser beam to be received by each photodiode, and the wavelength of the signal laser beam emitted from the semiconductor laser 30 can be monitored and adjusted with higher precision.

Embodiment 8

Figure 15:
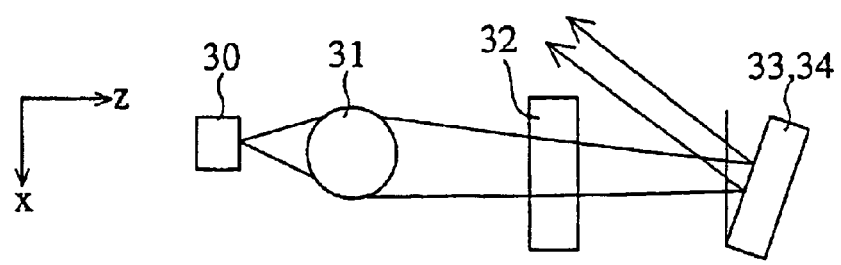
FIG. 15 is an upper view of a wavelength monitor according to an eighth embodiment of the present invention.
Figure 16:
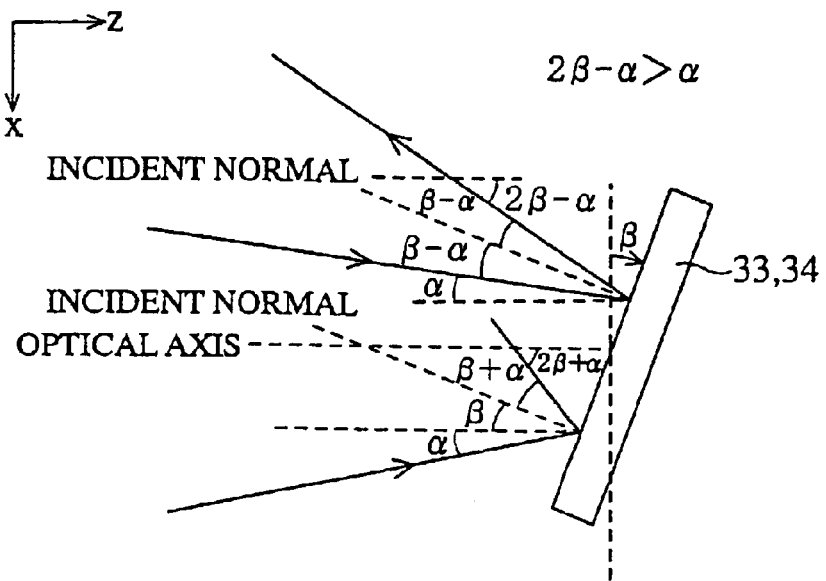
FIG. 16 is an explanatory view showing both an incident angle and a reflection angle of a laser beam incident on photodiodes shown in FIG. 15.

FIG. 15 shows an upper view of an exemplary wavelength monitor according to an eighth embodiment of the present invention. FIG. 16 is an explanatory view showing both an incident angle and a reflection angle of a laser beam incident on the photodiodes 33 and 34 shown in FIG. 15.

In the sixth embodiment, a part of the signal laser beam can be reflected by the photodiodes 33 and 34. Therefore, there is some probability that the reflected laser beam can be returned to an emission face of the semiconductor laser 30 as a returned laser beam, which can degrade characteristics of the semiconductor laser 30. Also, because a reflection factor at the emission face of the semiconductor laser 30 is set to a high value, there is a probability that a reflected laser beam can be resonated between the emission face of the semiconductor laser 30 and one of the photodiodes 33 and 34 and that the resonated laser beam can be detected in the photodiodes 33 and 34 as noise. In this case, the wavelength of the signal laser beam emitted from the semiconductor laser 30 cannot be accurately adjusted. The occurrence of the laser beam returning to the semiconductor laser 30 results from a regular reflection (that is, reflection for returning a laser beam to the drum lens 31) of part of the signal laser beam incident on the photodiodes 33 and 34, which then returns to the emission surface of the semiconductor laser 30. Therefore, in the eighth embodiment, the photodiodes 33 and 34 are inclined relative to the X-Y plane (e.g., as if rotated about the Y axis) to prevent the signal laser beam incident on the photodiodes 33 and 34 from being reflected according to the regular reflection and returned to the semiconductor laser.

In particular, a maximum angle between the signal laser beam transmitted through the drum lens 31 and an optical axis (which agrees with a center axis of the signal laser beam) of an optical system composed of the semiconductor laser 30, the drum lens 31, the wavelength filter 32 and the photodiodes 33 and 34 can be expressed by. In this case, as shown in FIG. 15, the photodiodes 33 and 34 can be inclined relative to the X axis so as to prevent the signal laser beam incident on the photodiodes 33 and 34 at the maximum angle from being reflected toward the drum lens 31. In other words, as shown in FIG. 16, in cases where the beam receiving faces of the photodiodes 33 and 34 are inclined by an angle larger than the maximum angle with respect to a line perpendicular to the optical axis on the X-Z plane, the signal laser beam incident on the photodiodes 33 and 34 is prevented from being reflected toward the drum lens 31 according to the regular reflection.

As shown in FIG. 16, in cases where the photodiodes 33 and 34 are inclined as if the photodiodes 33 and 34 were rotated about the Y axis in a clockwise direction, the signal laser beam that is directed slightly downward by the drum lens 31 in the positive X direction (also called a forward X direction) at the maximum angle with respect to the optical axis is then incident on the inclined photodiodes 33 and 34 at an incident angle−from an incident normal. The signal laser beam is then reflected at an angle 2− with respect to the optical axis upward in the negative X direction (also called a reversed X direction). The angle 2− is larger than the maximum angle. Also, the signal laser beam directed in the reversed X direction from the drum lens 31 at the maximum angle with respect to the optical axis is reflected at an angle 2+ with respect to the optical axis in the reversed X direction. The angle 2+ is larger than the maximum angle.

Also, in cases where the photodiodes 33 and 34 are inclined as if the photodiodes 33 and 34 were rotated about the Y axis in a counterclockwise direction, the signal laser beam that is directed in the reversed X direction by the drum lens 31 at the maximum angle with respect to the optical axis is then incident on the inclined photodiodes 33 and 34 at an incident angle − from an incident normal. The signal laser beam is then reflected at an angle 2− with respect to the optical axis in the forward X direction. The angle 2− is larger than the maximum angle. Also, the signal laser beam directed in the forward X direction at the maximum angle with respect to the optical axis is reflected at an angle 2+ with respect to the optical axis in the forward X direction. The angle 2+ is larger than the maximum angle.

As an example, a diameter of the drum lens 31 can be set to 2 mm, and a distance between the semiconductor laser 30 and the drum lens 31 can be set to 0.9 mm. In this case, when the photodiodes 33 and 34 are inclined by rotating the photodiodes 33 and 34 on the Y axis in a clockwise or counterclockwise direction by an angle larger than 20 degrees, there is no probability that the signal laser beam incident on the photodiodes 33 and 34 will be reflected toward the drum lens 31 according to the regular reflection.

As described above, in the eighth embodiment, because the photodiodes 33 and 34 are inclined as if the photodiodes 33 and 34 were rotated about the Y axis by the angle larger than the maximum angle of the signal laser beam to the optical axis, there is no probability that the signal laser beam incident on the photodiodes 33 and 34 will be reflected toward the drum lens 31 according to the regular reflection. Accordingly, because there is no probability that the signal laser beam reflected on the photodiodes 33 and 34 reaches the laser beam emission face of the semiconductor laser 30 as a returned laser beam, the rotation of the photodiodes 33 and 34 on the Y axis can prevent laser beam emission characteristics of the semiconductor laser 30 from deteriorating due to the returned laser beam. Also, because there is no probability that the signal laser beam will resonate between a high-reflection beam emission face of the semiconductor laser 30 and one of the photodiodes 33 and 34, the inclination of the photodiodes 33 and 34 can prevent the resonated signal laser beam from being detected in the photodiodes 33 and 34 as noise.

In the eighth embodiment, the photodiodes 33 and 34 are described as being inclined for a configuration in which the drum lens 31 is arranged according to the sixth embodiment, and the signal laser beam incident on the photodiodes 33 and 34 is reflected toward an area far from the drum lens 31 in the X direction. However, the photodiodes 33 and 34 can alternatively be inclined for a configuration in which the drum lens 31 is arranged according to the seventh embodiment. In this case, the photodiodes 33 and 34 are inclined as if rotated about the X axis by the angle larger than the maximum angle of the signal laser beam to the optical axis so as to reflect the signal laser beam incident on the photodiodes 33 and 34 toward an area far from the drum lens 31 in an upper direction (a forward Y direction).

Embodiment 9

Figure 17:
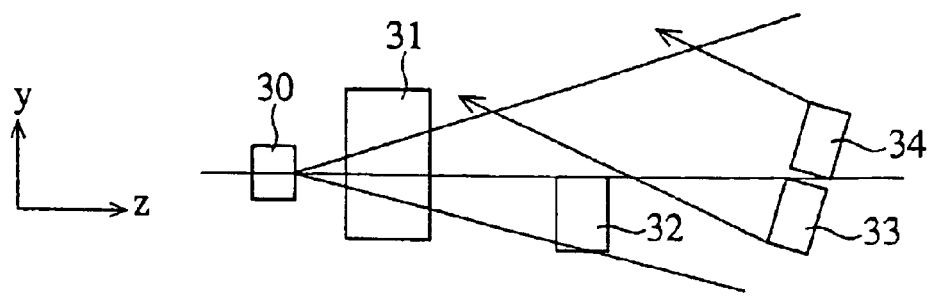
FIG. 17 is a side view of a wavelength monitor according to a ninth embodiment of the present invention.
Figure 18:
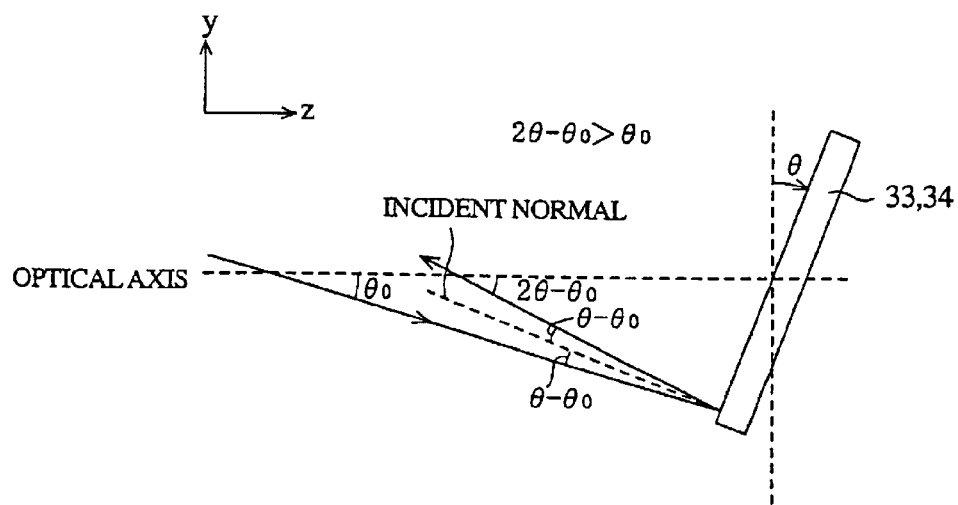
FIG. 18 is an explanatory view showing both an incident angle and a reflection angle of a laser beam incident on photodiodes shown in FIG. 17.

FIG. 17 shows a side view of an exemplary wavelength monitor according to a ninth embodiment of the present invention. FIG. 18 is an explanatory view showing both an incident angle and a reflection angle of a laser beam incident on the photodiodes 33 and 34 shown in FIG. 17.

In the sixth embodiment illustrated in the example of FIG. 8, when the signal laser beam passing toward a lower direction is reflected by the photodiode 33 or 34, a reflected laser beam is further directed toward the lower direction. Therefore, the reflected laser beam is repeatedly reflected on constituent members (for example, the base carrier 11) placed under the drum lens 31, the wavelength filter 32 and the photodetectors 33 and 34, and the reflected laser beam may be finally detected as noise in the photodiodes 33 and 34. Therefore, there is some probability that the wavelength control of the signal laser beam cannot be correctly performed in the wavelength monitor.

To avoid this problem, in the ninth embodiment, the photodiodes 33 and 34 are inclined by rotating the photodiodes 33 and 34 about the X axis, and the beam receiving faces of the photodiodes 33 and 34 are directed toward the upper direction (or the forward Y direction). In this instance, because the signal laser beam is not converged in the Y direction by the drum lens 31 and because the second photodiode 34 is placed just above the first photodiode 33, an elevation angle of a laser beam reflected by the second photodiode 34 is larger than that of a laser beam reflected by the first photodiode 33. Therefore, the photodiodes 33 and 34 are inclined so as to reflect a laser beam incident on the lowest portion of the first photodiode 33 toward an area higher than an optical path of the incident laser beam.

In particular, in an optical system comprising of the semiconductor laser 30, the drum lens 31, the wavelength filter 32 and the photodiodes 33 and 34, an optical distance L between a position of the photodiodes 33 and 34 crossing the optical axis and a beam emission face of the semiconductor laser 30 is obtained by adding a product of a length of the drum lens 31 on the optical axis and a refractive index of the drum lens 31, a product of a length of the wavelength filter 32 on the optical axis and a refractive index of the wavelength filter 32 and a length of space having no optical elements along the optical axis. Also, an optical distance between the optical axis and the lowest portion of the first photodiode 33 is expressed by D. In this case, as shown in FIG. 18, because the signal laser beam is incident on the lowest portion of the first photodiode 33 at an angle $_0=\tan^{-1}(D/L)$ to the optical axis, the photodiodes 33 and 34 are inclined by an angle higher than the angle $_0=\tan^{-1}(D/L)$ as if the photodiodes 33 and 34 were rotated about the X axis to direct the beam receiving faces of the photodiodes 33 and 34 toward the upper direction. Therefore, the signal laser beam incident on the lowest portion of the first photodiode 33 at an incident angle $-_0$ relative to an incident normal is reflected in the forward Y direction at an angle $2-_0$ relative to the optical axis. The angle $2-_0$ is higher than the angle $_0$.

As is described above, in the ninth embodiment, because the photodiodes 33 and 34 are inclined by the angle higher than the angle $_0=\tan^{-1}(D/L)$ as if rotated clockwise about the X axis to direct the beam receiving faces of the photodiodes 33 and 34 toward the upper direction, the whole signal laser beam is reflected by the photodiodes 33 and 34 toward an area above an optical path of the laser beam incident on the lowest portion of the first photodiode 33. Accordingly, the photodiodes 33 and 34 can be prevented from detecting the laser beam reflected by the photodiodes 33 and 34 as noise.

In the ninth embodiment, the photodiodes 33 and 34 are described as being inclined for a configuration in which the drum lens 31 is arranged according to the sixth embodiment and in which the signal laser beam incident on the photodiodes 33 and 34 is reflected in the upper direction. However, the photodiodes 33 and 34 can alternatively be inclined for a configuration in which the drum lens 31 is arranged according to the seventh embodiment. In this case, the photodiodes 33 and 34 are inclined toward the right or left direction by the angle larger than the angle $_0=\tan^{-1}(D/L)$ as if rotated clockwise or counterclockwise about the Y axis, and the signal laser beam incident on the photodiodes 33 and 34 is reflected toward an area far from the drum lens 31 in the X direction.

Embodiment 10

Figure 19:
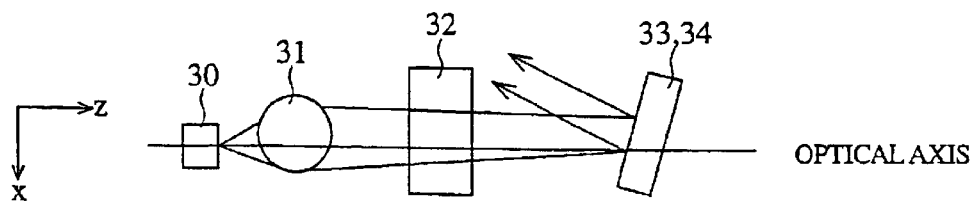
FIG. 19 is a top view of a wavelength monitor according to a tenth embodiment of the present invention.

FIG. 19 shows a top view of an exemplary wavelength monitor according to a tenth embodiment of the present invention. In the eighth embodiment illustrated in FIG. 15, the drum lens 31 is described as being arranged symmetrically with respect to the optical axis of the optical system. In the tenth embodiment, the drum lens 31 is shifted from the optical axis toward the reversed X direction (or the forward X direction).

As shown in FIG. 19, the photodiodes 33 and 34 are inclined as if rotated clockwise (or counterclockwise) about the Y axis, and the center axis (also called the axial line) of the drum lens 31 is shifted from a position crossing the optical axis in the reversed X direction (or the forward X direction). In this case, because the drum lens 31 is shifted toward the reversed X direction (or the forward X direction), the signal laser beam incident on the drum lens 31 and transmitted through the drum lens 31 is shifted toward the reversed X direction (or the forward X direction) as compared with the signal laser beam of the eighth embodiment, and the signal laser beam shifted toward the reversed X direction (or the forward X direction) is incident on the photodiodes 33 and 34. Therefore, the signal laser beam reflected by the photodiodes 33 and 34 passes through an area farther away from the drum lens 31 as compared with the reflected signal laser beam of the eighth embodiment.

As described above, in the tenth embodiment, the photodiodes 33 and 34 are inclined as if rotated clockwise (or counterclockwise) about the Y axis, and the center axis of the drum lens 31 is shifted from a position crossing the optical axis toward the reversed X direction (or the forward X direction). Accordingly, the signal laser beam reflected by the photodiodes 33 and 34 can be prevented from being incident on the beam emission face of the semiconductor laser 30 as a returned laser beam, and beam emission characteristics of the semiconductor laser 30 can be prevented from deteriorating due to the returned laser beam.

In the tenth embodiment, the drum lens 31 is described as being shifted for a configuration in which the drum lens 31 is arranged according to the sixth embodiment. However, the drum lens 31 can alternatively be shifted for a configuration in which the drum lens 31 is arranged according to the seventh embodiment. In this case, the drum lens 31 is shifted toward the forward Y direction so as to reflect the signal laser beam incident on the photodiodes 33 and 34 toward the further upper direction.

Embodiment 11

Figure 20:
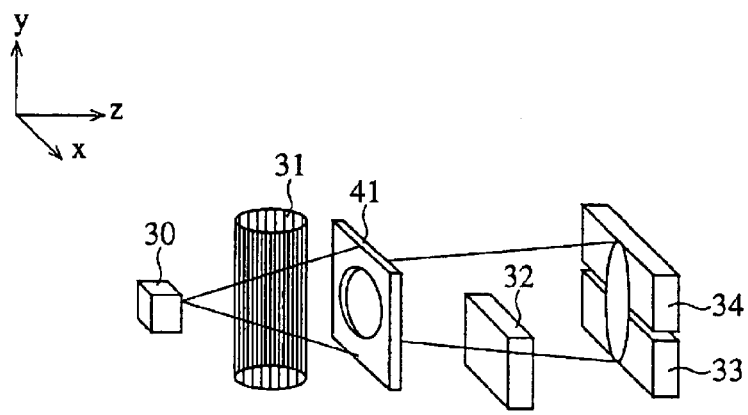
FIG. 20 is an upper-oblique view of a wavelength monitor according to an eleventh embodiment of the present invention.

FIG. 20 shows an upper-oblique view of an exemplary wavelength monitor according to an eleventh embodiment of the present invention. In the sixth embodiment illustrated in FIG. 8, a part of the signal laser beam emitted from the semiconductor laser 30 is not received by the photodiodes 33 and 34 but is repeatedly reflected on a package wall (not shown) surrounding the wavelength monitor, the base carrier (not shown) and other members as stray laser beams, and the stray laser beams are gradually absorbed in the package wall, the base carrier 11 and the other members. However, in cases where the stray laser beams are received by the photodiodes 33 and 34 before being sufficiently attenuated, the stray laser beams may be detected as noise in the photodiodes 33 and 34. To avoid this potential problem, in the eleventh embodiment, such stray laser beams are prevented from being detected as noise by the photodiodes 33 and 34.

In FIG. 20, reference numeral 41 indicates a beam shielding plate 41 having an aperture. The beam shielding plate 41 is arranged between the drum lens 31 and the wavelength filter 32, and a surface of the beam shielding plate 41 facing the drum lens 31 is preferably coated black so as to absorb the signal laser beam. Part of the signal laser beam, which transmits through the drum lens 31 and is directed to the photodiodes 33 and 34, passes through the aperture of the beam shielding plate 41, and the other part of the signal laser beam not directed to the photodiodes 33 and 34 is absorbed. Also, a part of the signal laser beam, which would otherwise be reflected on the base carrier (not shown) before being received by the photodiodes 33 and 34, is absorbed by the beam shielding plate 41.

As described above, in the eleventh embodiment, because the beam shielding plate 41 having an aperture is arranged between the drum lens 31 and the wavelength filter 32, the part of the signal laser beam not directed to the photodiodes 33 and 34 is absorbed by the beam shielding plate 41. Accordingly, there is little probability that the stray laser beams will be generated, and the wavelength of the signal laser beam can be further precisely monitored. Also, the wavelength of the signal laser beam emitted from the semiconductor laser 30 can be further precisely adjusted according to the monitored wavelength.

Also, in the eleventh embodiment, the beam shielding plate 41 prevents the signal laser beam, which transmits through the wavelength filter 32, from being received by the second photodiode 34. Accordingly, the wavelength of the signal laser beam can be further precisely monitored.

In the eleventh embodiment, the beam shielding plate 41 having an aperture is described as being arranged between the drum lens 31 and the wavelength filter 32. However, the position of the beam shielding plate 41 is not limited to the above-noted placement, and the beam shielding plate 41 can be arranged elsewhere between the semiconductor laser 30 and the photodiodes 33 and 34. For example, the beam shielding plate 41 can be arranged between the semiconductor laser 30 and the drum lens 31. Alternatively, the beam shielding plate 41 be arranged between the wavelength filter 32 and the photodiodes 33 and 34.

Also, in the eleventh embodiment, the utilization of a single beam shielding plate 41 in the wavelength monitor is described. However, a plurality of beam shielding plates 41 can be arranged in the wavelength monitor. In this manner, stray laser beams can be efficiently prevented.

Also, in the eleventh embodiment, the aperture of the beam shielding plate 41 is described as being formed in a circular shape. However, the shape of the aperture of the beam shielding plate 41 is not limited to a circular shape.

Embodiment 12

Figure 21:
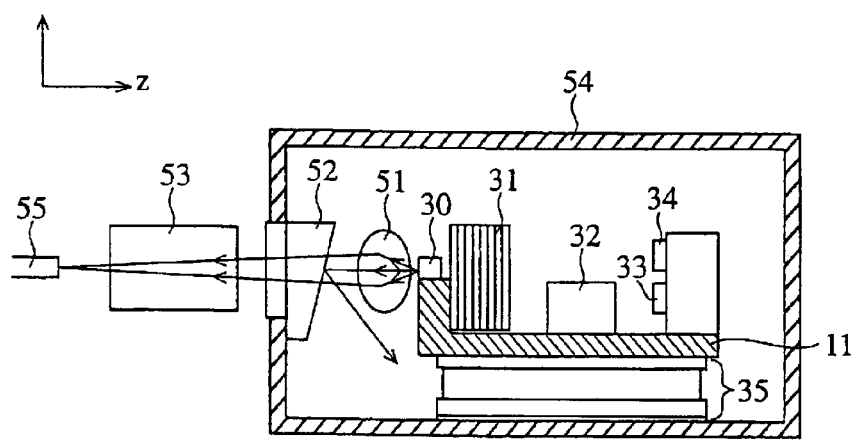
FIG. 21 is a side view of a semiconductor laser device according to a twelfth embodiment of the present invention.

FIG. 21 shows a side view of an exemplary semiconductor laser device according to a twelfth embodiment of the present invention. In the sixth to eleventh embodiments, the wavelength of a forward laser beam emitted from the semiconductor laser 30 is adjusted by monitoring the wavelength of the backward laser beam in the wavelength monitors. In a semiconductor laser device according to the twelfth embodiment, even if a forward laser beam emitted from the semiconductor laser 30 is reflected on a constituent member, the reflected laser beam is prevented from being detected in the photodiodes 33 and 34 as noise.

In FIG. 21, reference numeral 51 indicates a first lens for converging a forward laser beam (also called an output signal laser beam) emitted from the semiconductor laser 30. Reference numeral 54 indicates a metallic package. The semiconductor laser 30, the drum lens 31, the wavelength filter 32, the photodiodes 33 and 34, the base carrier 11 and the temperature keeping device 35 are arranged in the package 54. The package 54 has a bottom portion, and the semiconductor laser 30 is indirectly supported on the bottom portion of the package 54. Reference numeral 52 indicates a wedge-shaped window formed on a side surface of the package 54. A thickness of the window 52 on the lower side is smaller than that on the upper side, and a face of the window 52 facing the first lens 51 is directed toward the bottom portion of the package 54. A majority of the output signal laser beam converged in the first lens 51 transmits through the window 52, and the other part of the output signal laser beam is reflected diagonally toward the lower direction. In this case, the distance between the window 52 and the first lens 51 is sufficiently large that the first lens 51 does not receive the reflected output signal laser beam. Reference numeral 53 indicates an optical isolator. The output signal laser beam transmitting through the window 52 is sent to an optical fiber 55 through the optical isolator 53 with almost no attenuation, and a laser beam returned from the optical fiber 55 is intercepted in the optical isolator 53.

An exemplary operation of the semiconductor laser device according to the twelfth embodiment will now be described.

An output signal laser beam emitted forward (in the left direction in FIG. 21) from the semiconductor laser 30 is converged by the first lens 51, and a majority of the converged output signal laser beam transmits through the window 52. The output signal laser beam further transmits through the optical isolator 53 with almost no attenuation, and the output signal laser beam is then coupled to the optical fiber 55 through a forward optical system (not shown). Also, a portion of the output signal laser beam converged by the first lens 51 is reflected by the face of the window 52. In this case, because the thickness of the window 52 on the lower side is smaller than that on the upper side, the reflected portion of the output signal laser beam is reflected diagonally in the lower direction (in the lower right direction in FIG. 21). Because the distance between the window 52 and the first lens 51 is sufficiently widened, the reflected output signal laser beam passes through a lower area of the semiconductor laser 30 without being received by the first lens 51. Because the base carrier 11 and the temperature keeping device 35 are arranged in the lower area of the semiconductor laser 30, the reflected output signal laser beam is intercepted by the base carrier 11 or the temperature keeping device 35. Therefore, the reflected output signal laser beam is prevented from passing toward the rear area of the semiconductor laser 30, and there is no probability that the reflected output signal laser beam will be detected in the photodiodes 33 and 34 as noise. Also, because the thickness of the window 52 formed in the wedge shape is gradually changed in the vertical direction, there is no probability that the output signal laser beam will resonate within the window 52.

As described above, in the twelfth embodiment, the wedge-shaped window 52, of which the thickness on the lower side is smaller than that on the upper side, is arranged at the forward side of the semiconductor laser 30, and the distance between the window 52 and the first lens 51 is sufficiently widened. Therefore, there is no probability that the output signal laser beam reflected on the window 52 is detected by the photodiodes 33 and 34 as noise. Accordingly, the wavelength of the signal laser beam can be further precisely monitored by the photodiodes 33 and 34. Also, the wavelength of the signal laser beam emitted from the semiconductor laser 30 can be further precisely adjusted according to the monitored wavelength.

In the twelfth embodiment, the wedge-shaped window 52 is provided. However, a flat plate type window can alternatively be diagonally arranged so as to reflect the output signal laser beam toward the diagonally-lower direction. In this case, though there is some probability that the output signal laser beam may be resonated between both surfaces of the flat plate type window according to an etalon effect, the configuration of the semiconductor laser device can be simplified.

Embodiment 13

Figure 22:
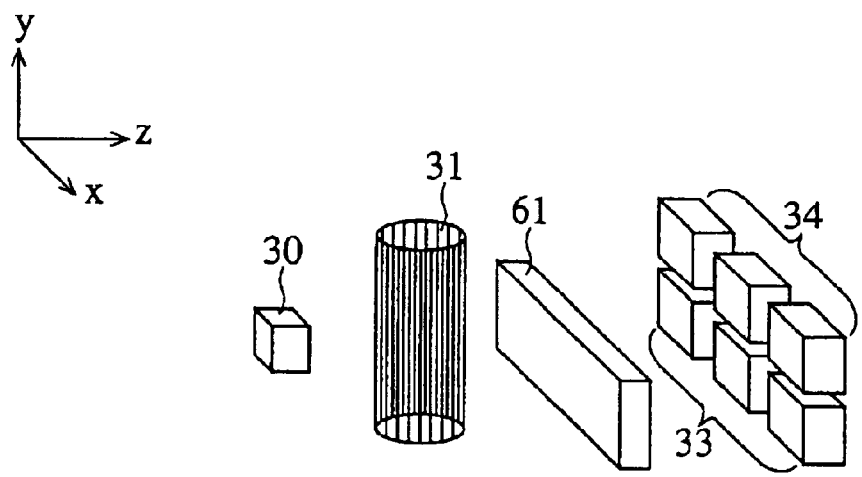
FIG. 22 is an upper-oblique view of a wavelength monitor according to a thirteenth embodiment of the present invention.
Figure 23:
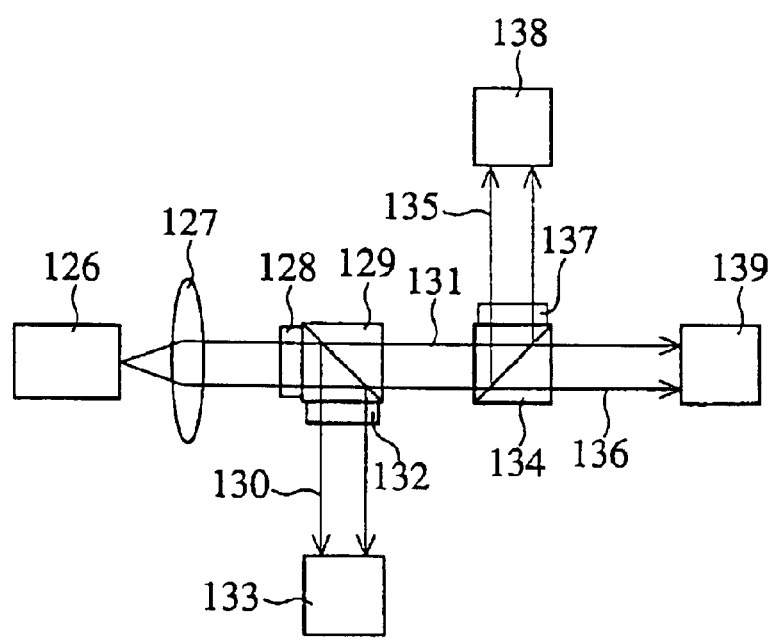
FIG. 23 is a view schematically showing an optical system of a conventional wavelength monitor in which an intensity and varying wavelength of a laser beam is monitored.

FIG. 22 shows an upper-oblique view of an exemplary wavelength monitor according to a thirteenth embodiment of the present invention.

As is described in the first embodiment, the X-directional positional precision for the optical elements can deteriorate due to a temperature variation and/or a mechanical variation occurring over a long period of time as compared to the Y-directional positional precision. Therefore, a high precision in placement of components is required for the detection of the beam intensity in the X direction by the photodiodes 33 and 34 as compared with the detection in the Y direction. The thirteenth embodiment facilitates this required precision.

As shown in FIG. 22, to heighten the precision of the detection of the beam intensity in the X direction, a plurality of sets of photodiodes 33 and 34 (or a plurality of twin photodiodes) are arranged along a line along the X direction in a plane parallel to the X-Y plane. Reference numeral 61 indicates a wavelength filter lengthened in the X direction. The wavelength filter 61 has the same function as that of the wavelength filter 32. That is, the transmissivity of the wavelength filter 61 varies depending upon the wavelength of the signal laser beam, and an intensity of the signal laser beam is changed by the wavelength filter 61 according to a wavelength of the signal laser beam.

The sets of photodiodes 33 and 34 can be obtained by forming a plurality of beam receiving faces on a photodiode device. A distance between each pair of beam receiving faces adjacent to each other is preferably set as short as possible. Therefore, even if a longitudinally-lengthened elliptical laser beam wider in the X direction than that in the sixth embodiment is formed by the drum lens 31, the lower half part of the elliptical laser beam can transmit through the wavelength filter 61, and the intensity of the elliptical laser beam can be reliably detected by the sets of photodiodes 33 and 34. In this case, because an area of the elliptical laser beam received by the sets of photodiodes 33 and 34 is increased in the X direction, the precision of the detection of the beam intensity in the X direction can be improved. In other words, the X-directional tolerance in the detection of the beam intensity can be increased.

As described above, in the thirteenth embodiment, the sets of photodiodes 33 and 34 are arranged in a line along the X direction in a plane parallel to the X-Y plane, and the wavelength filter 61 lengthened in the X direction is provided. Therefore, the precision of the detection of the beam intensity in the X direction can be improved.

The invention has been described with reference to particular embodiments. However, it will be readily apparent to those skilled in the art that it is possible to embody the invention in specific forms other than those of the embodiments described above. This can be done without departing from the spirit of the invention. The embodiments described herein are merely illustrative and should not be considered restrictive in any way. The scope of the invention is given by the appended claims, rather than the preceding description, and all variations and equivalents which fall within the range of the claims are intended to be embraced therein.

What is claimed is:

1. A wavelength monitor, comprising:
   a cylindrical lens configured to allow a laser beam emitted from a semiconductor laser to pass therethrough;
   first and second photodetectors configured to receive the laser beam passed through the cylindrical lens; and
   a wavelength filter disposed in an optical path between the semiconductor laser and the first photodetector,
   wherein the wavelength filter is disposed outside an optical path between the semiconductor laser and the second photodetector.

2. A wavelength monitor according to claim 1, wherein the wavelength filter is disposed in the optical path between the cylindrical lens and the first photodetector.

3. A semiconductor laser device, comprising:
   a semiconductor laser configured to emit a laser beam;
   a cylindrical lens configured to allow the laser beam emitted from the semiconductor laser to pass therethrough;
   first and second photodetectors configured to receive the laser beam passed through the cylindrical lens; and
   a wavelength filter disposed in an optical path between the semiconductor laser and the first photodetector,
   wherein the wavelength filter is disposed outside an optical path between the semiconductor laser and the second photodetector.

4. A semiconductor laser device according to claim 3, wherein the wavelength filter is a birefringence filter.

5. A semiconductor laser device according to claim 3, wherein the wavelength filter is a birefringence filter comprising a $YVO_4$ crystal, a $LiNbO_3$ crystal and a polarizer.

6. A semiconductor laser device according to claim 3, wherein each of the first and second photodetectors has an elongated beam receiving face and wherein an elongation direction of each of the first and second photodetectors is oriented perpendicular to a center axis of the cylindrical lens.

7. A semiconductor laser device according to claim 3, wherein each of the first and second photodetectors has a rectangular beam receiving face, each rectangular beam receiving face having four sides, two of the sides of each rectangular beam receiving face being perpendicular to a center axis of the cylindrical lens.

8. A semiconductor laser device according to claim 3, wherein the wavelength filter is disposed in the optical path between the cylindrical lens and the first photodetector.

9. A semiconductor laser device according to claim 3, further comprising a beam shielding plate which has an aperture and which is arranged between the semiconductor laser and the first and second photodetectors.

10. A semiconductor laser device according to claim 3, further comprising a positioning member having two plane surfaces that contact the cylindrical lens.

11. A semiconductor laser device according to claim 3, further comprising a positioning member fixed to the cylindrical lens with a gold-tin alloy or with a glass material having a low melting point.

12. A semiconductor laser device according to claim 3, wherein at least one of the first and second photodetectors has a plurality of photodiodes.

13. A semiconductor laser device according to claim 3, further comprising:
    a temperature-keeping device to which the semiconductor laser is directly or indirectly attached; and
    a control circuit configured to control the temperature-keeping device according to a ratio of an intensity of the laser beam received by the second photodetector to an intensity of the laser beam received by the first photodetector.

14. A semiconductor laser device according to claim 3, further comprising:
    a temperature-detecting unit configured to measure a temperature of the semiconductor laser;
    a temperature-keeping device to which the semiconductor laser is directly or indirectly attached; and
    a control circuit configured to control the temperature-keeping device according to the temperature of the semiconductor laser measured by the temperature-detecting unit and according to a ratio of an intensity of the laser beam received by the second photodetector to an intensity of the laser beam received by the first photodetector.

15. A semiconductor laser device according to claim 3, further comprising:
    a temperature-detecting unit configured to measure a temperature of the semiconductor laser;
    a temperature-keeping device to which the semiconductor laser is directly or indirectly attached; and
    a control circuit configured to control the temperature-keeping device according to the temperature of the semiconductor laser measured by the temperature-detecting unit and an intensity of the laser beam received by the second photodetector.

16. A semiconductor laser device according to claim 3, further comprising a control circuit configured to control the semiconductor laser according to an intensity of the laser beam received by the second photodetector.

17. A semiconductor laser device according to claim 3, wherein the first photodetector and the second photodetector are disposed adjacent to each other in a direction parallel to a center axis of the cylindrical lens.

18. A semiconductor laser device according to claim 17, wherein a beam diameter of the laser beam passed through the cylindrical lens in a first direction parallel to the center axis of the cylindrical lens in a plane that includes a beam receiving face of the first photodetector and a beam receiving face of the second photodetector is longer than a summed length of both the beam receiving face of the first photodetector and the beam receiving face of the second photodetector in the first direction, and wherein a beam diameter of the laser beam passed through the cylindrical lens in a second direction perpendicular to the first direction in the plane that includes the beam receiving faces of the first and second photodetectors is shorter than a length of any of the beam receiving faces of the first and second photodetectors in the second direction.

19. A semiconductor laser device according to claim 3, wherein the beam receiving faces of the first and second photodetectors are inclined relative to a plane perpendicular to an optical axis of the semiconductor laser device.

20. A semiconductor laser device according to claim 19, wherein a beam diameter of the laser beam passed through the cylindrical lens in a first direction parallel to the center axis of the cylindrical lens in a plane that includes a beam receiving face of the first photodetector and a beam receiving face of the second photodetector is longer than a summed length of both the beam receiving face of the first photodetector and the beam receiving face of the second photodetector in the first direction, and wherein a beam diameter of the laser beam passed through the cylindrical lens in a second direction perpendicular to the first direction in the plane that includes the beam receiving faces of the first and second photodetectors is shorter than a length of any of the beam receiving faces of the first and second photodetectors in the second direction.

21. A semiconductor laser device according to claim 19, wherein the beam receiving faces of the first and second photodetectors are inclined relative to the plane perpendicular to the optical axis of the semiconductor laser device by an angle larger than a maximum angle formed between the laser beam passed through the cylindrical lens and the optical axis of the semiconductor laser device.

22. A semiconductor laser device according to claim 19, wherein an optical length between the semiconductor laser device and an intersection of the optical axis of the semiconductor laser and a plane that includes beam receiving faces of the first and second photodetectors is expressed by L, an optical length between the optical axis of the semiconductor laser device and a position of the beam receiving faces of the first and second photodetectors farthest from the optical axis of the semiconductor laser device is expressed by D, and the beam receiving faces of the first and second photodetectors are inclined by an angle larger than $\tan^{-1}(D/L)$ relative to the plane perpendicular to the optical axis of the semiconductor laser device.

23. A semiconductor laser device according to claim 19, wherein a center axis of the cylindrical lens is shifted relative to the optical axis of the semiconductor laser device.

24. A semiconductor laser device according to claim 3, wherein the cylindrical lens has a cut-out surface.

25. A semiconductor laser device according to claim 24, wherein a flat portion of the cut-out surface is oriented substantially parallel to an optical axis of the semiconductor laser device.

26. A semiconductor laser device according to claim 24, further comprising a positioning member that contacts the cut-out surface.

27. A semiconductor laser device according to claim 24, wherein the laser beam enters a first cylindrical surface portion of the cylindrical lens adjacent to a first edge of the cut-out surface and exits a second cylindrical surface portion of the cylindrical lens adjacent to a second edge of the cut-out surface.

28. A semiconductor laser device according to claim 27, wherein the first and second cylindrical surface portions each have an antireflection coating.

29. A semiconductor laser device according to claim 3, further comprising an L-shaped positioning member that contacts a cylindrical surface of the cylindrical lens at two locations on the cylindrical lens.

30. A semiconductor laser device according to claim 29, wherein each of the first and second photodetectors has an elongated beam receiving face and wherein an elongation direction of each of the first and second photodetectors is oriented perpendicular to a center axis of the cylindrical lens.

31. A semiconductor laser device according to claim 30, wherein a beam diameter of the laser beam passed through the cylindrical lens in a first direction parallel to the center axis of the cylindrical lens in a plane that includes a beam receiving face of the first photodetector and a beam receiving face of the second photodetector is longer than a summed length of both the beam receiving face of the first photodetector and the beam receiving face of the second photodetector in the first direction, and wherein a beam diameter of the laser beam passed through the cylindrical lens in a second direction perpendicular to the first direction in the plane that includes the beam receiving faces of the first and second photodetectors is shorter than a length of any of the beam receiving faces of the first and second photodetectors in the second direction.

32. A semiconductor laser device according to claim 31, wherein the cylindrical lens has a cut-out surface and wherein a flat portion of the cut-out surface is oriented substantially parallel to an optical axis of the semiconductor laser device.

33. A semiconductor laser device according to claim 3, further comprising:
a package wherein the semiconductor laser, the first and second photodetectors and the wavelength filter are housed therein; and
a wedge-shaped window attached to the package and having a wedge-shaped cross section,
wherein the semiconductor laser is configured to further emit another laser beam which is transmitted outside the package through the wedge-shaped window.

34. A semiconductor laser device according to claim 33, further comprising:
another lens which is arranged between the semiconductor laser and the wedge-shaped window and which is separated from the wedge-shaped window such that the another lens does not receive a reflected portion of the another laser beam reflected by the wedge-shaped window.

35. A semiconductor laser device according to claim 33, wherein the wedge-shaped window has an inclined surface which is inclined relative to a direction perpendicular to an optical axis of the semiconductor laser device.

36. A semiconductor laser device according to claim 35, wherein the package has a bottom portion supporting the semiconductor laser and wherein the inclined surface faces the bottom portion of the package.

37. A semiconductor laser device, comprising:
a semiconductor laser configured to emit a laser beam;
a cylindrical lens configured to allow a laser beam emitted from the semiconductor laser to pass therethrough;
detecting means for detecting the laser beam passed through the cylindrical lens; and
intensity changing means for changing the intensity of a portion of the laser beam depending upon the wavelength of the laser beam, the intensity changing means being disposed in an optical path between the semiconductor laser and the detecting means such that another portion of the laser beam is detected by the detecting means without impinging upon the intensity changing means.

38. A semiconductor laser device according to claim 3, wherein the beam receiving face of the first photodetector and the beam receiving face of the second photodetector are placed on different planes from each other.

39. A method of monitoring the wavelength of a laser beam emitted by a semiconductor laser, comprising:
directing a laser beam through a cylindrical lens, thereby forming a uniaxially converged laser beam;

directing a first portion of the uniaxially converged laser beam through a wavelength filter to a first photodetector;

directing a second portion of the uniaxially converged laser beam to a second photodetector;

determining a signal intensity ratio of a first signal intensity measured by the first photodiode to a second signal intensity measured by the second photodiode; and comparing the signal intensity ratio to a reference signal intensity ratio that corresponds to a present wavelength.

40. The method of claim 39, wherein the second portion of the uniaxially converged laser beam is directed to the second photodetector without passing through the wavelength filer.

* * * * *